(12) United States Patent
Moriyama et al.

(10) Patent No.: US 8,049,746 B2
(45) Date of Patent: Nov. 1, 2011

(54) DISPLAY DRIVING APPARATUS, DISPLAY MODULE PACKAGE, DISPLAY PANEL MODULE, AND TELEVISION SET

(75) Inventors: Seiichi Moriyama, Kyoto (JP); Jyunichi Suenaga, Osaka (JP); Kenji Yamashita, Osaka (JP)

(73) Assignee: Panasonic Corporation, Osaka (JP)

( * ) Notice: Subject to any disclaimer, the term of this patent is extended or adjusted under 35 U.S.C. 154(b) by 415 days.

(21) Appl. No.: 12/428,742

(22) Filed: Apr. 23, 2009

(65) Prior Publication Data

US 2009/0289933 A1 Nov. 26, 2009

(30) Foreign Application Priority Data

May 22, 2008 (JP) ................................. 2008-134379

(51) Int. Cl.
*G06F 3/038* (2006.01)
(52) U.S. Cl. ............. 345/213; 345/98; 345/99; 345/100
(58) Field of Classification Search ..................... 345/60, 345/98–100, 204, 212–214; 377/64, 67
See application file for complete search history.

(56) References Cited

U.S. PATENT DOCUMENTS

| | | | |
|---|---|---|---|
| 5,489,867 A | 2/1996 | Tamanoi | |
| 6,900,781 B1 | 5/2005 | Mori et al. | |
| 6,909,417 B2 * | 6/2005 | Washio et al. | 345/98 |
| 7,002,544 B2 | 2/2006 | Sekido | |
| 7,116,137 B2 | 10/2006 | Nautiyal et al. | |
| 7,236,147 B2 | 6/2007 | Morita et al. | |
| 7,298,174 B2 | 11/2007 | Poechmueller | |
| 7,598,929 B2 * | 10/2009 | Ohnuki et al. | 345/60 |
| 2003/0098833 A1 | 5/2003 | Sekido et al. | |
| 2004/0070559 A1 | 4/2004 | Liang | |
| 2006/0114178 A1 | 6/2006 | Yang et al. | |
| 2007/0070005 A1 | 3/2007 | Okamura | |
| 2007/0115219 A1 | 5/2007 | Inoue et al. | |
| 2007/0188415 A1 | 8/2007 | Inoue | |
| 2007/0188416 A1 | 8/2007 | Inoue | |

FOREIGN PATENT DOCUMENTS

JP 2953342 B2 7/1999

OTHER PUBLICATIONS

English language Abstract of JP 8-305319 A (Nov. 22, 1996).

\* cited by examiner

*Primary Examiner* — Abbas Abdulselam
(74) *Attorney, Agent, or Firm* — Greenblum & Bernstein, P.L.C.

(57) ABSTRACT

A display driving apparatus includes: n level shift units shifting a voltage level of n pixel data; a step potential providing unit providing a step potential; a change judgment unit judging whether or not each of the n pixel data has changed from pixel data of an immediately previous cycle; a delay unit generating n timing signals changing with different timings; and a control unit performing control such that the display output terminal corresponding to the pixel data judged to have changed by the change judgment unit is provided with: the step potential provided by the step potential providing unit during a first time period included in each of the cycle; and a potential shifted by the corresponding level shift unit during a second time period that is different from each other and is based on a timing of change of the corresponding timing signal.

15 Claims, 14 Drawing Sheets of the present invention relates to a display driving apparatus, a display module package, a display panel module, and a television set. The present invention relates in particular to the display driving apparatus that outputs n drive signals each of which drives a panel electrode, to n display output terminals in a predetermined cycle according to display data for a single line including n pixel data.

DISPLAY DRIVING APPARATUS, DISPLAY MODULE PACKAGE, DISPLAY PANEL MODULE, AND TELEVISION SET

BACKGROUND OF THE INVENTION (1) Field of the Invention

The present invention relates to a display driving apparatus, a display module package, a display panel module, and a television set. The present invention relates in particular to the display driving apparatus that outputs n drive signals each of which drives a panel electrode, to n display output terminals in a predetermined cycle according to display data for a single line including n pixel data.

(2) Description of the Related Art

In recent years, a plasma display panel (PDP) has been attracting attention as a high-definition display panel having a flat large screen. The PDP is provided with, as pixels, discharge cells arranged in a matrix. The PDP displays an image using emission of light resulting from electric discharge of the discharge cells.

A PDP of a general AC-type includes display electrodes arranged parallel to one another and data electrodes arranged perpendicular to the display electrodes. A display driving apparatus of the PDP drives the data electrodes, which means a drive-target of the display driving apparatus is a capacitive load.

Along with advancements in the PDP, such as a larger screen, a higher definition, and a higher luminance, a display driving apparatus that drives the PDP has also been required to achieve a multi-output, a lower electromagnetic interference (EMI), and lower power consumption. Therefore, it has been becoming more important to suppress power consumption when driving a data electrode and resultant heat of driving, and reduce an EMI noise resulting from a change of data.

When different potentials are applied to two data electrodes, the electrodes function as a capacitance. In other words, a capacitive load is generated. The display driving apparatus consumes a lot of power when driving the capacitive load. In order to address the above, a display driving apparatus disclosed by Patent Reference 1: U.S. Pat. No. 7,116,137 is known as a conventional technique for reducing power consumption of the display driving apparatus.

The display driving apparatus according to the Patent Reference 1 converts display data to a predetermined voltage level and outputs the converted display data to a display output terminal connected to a data electrode. The display driving apparatus according to the Patent Reference 1 can reduce driving power with a two-step voltage driving method.

The display driving apparatus according to the Patent Reference 1 includes a common floating potential line connected to plural display output terminals in a floating state via a selection switch in a form of wired OR connection.

The display driving apparatus according to the Patent Reference 1 detects a change in a voltage level prior to and subsequent to a change of the display data. The display driving apparatus according to the Patent Reference 1 controls: the display output terminal of which the voltage level changes to temporarily enter a high-impedance (Hi-Z) state, with a predetermined timing (within a panel-nondisplay period for switching the display data); and at the same time, the selection switch so that the display output terminal is connected to the floating potential line. The control causes all of the display output terminals where data changes depending on the switching of the display data to have temporarily blocked display output and connected to the common floating potential line.

Accordingly, the display output terminal of which the voltage level changes is short-circuited, so that capacitive charge accumulated between the display output terminals to which an H (High) level or an L (Low) level is outputted immediately before is moved. This allows the display output terminal of the H level and the display output terminal of the L level to be balanced in number, causing the common floating potential line in a floating state to stay at a certain potential.

For example, in the display output terminals of which the voltage level changes, when the H level display output terminal and the L level display output terminal are the same in number, the common floating potential line ideally becomes VDD/2 (VDD is the H level potential of the display output terminal). Therefore, it is sufficient for the display driving apparatus to drive from VDD/2 to GND or to VDD. With this, the display driving apparatus according to the Patent Reference 1 can reduce driving power consumption.

Further, a conventional technique that reduces the EMI when display data changes is disclosed by Patent Reference 2: Japanese Patent No. 2953342.

In the technique disclosed by the Patent Reference 2, plural data electrodes that display pixel data for a single line is divided into plural sets of data electrodes, and a timing for a display output is sequentially shifted between the sets of data electrodes. With this, the technique disclosed by the Patent Reference 2 can group the number of data that changes at the same time into set units, thereby reducing a current peak. According to the above, the technique disclosed by the Patent Reference 2 can reduce the EMI that occurs.

However, with the display driving apparatus of the Patent Reference 1, the potential of the common floating potential line changes depending on a pattern of display data. For example, in the case where all of the output terminals change from the H level to the L level when switching the display data, the display driving apparatus disclosed by the Patent Reference 1 cannot reduce power consumption. More specifically, the display driving apparatus disclosed by the Patent Reference 1 depends on a pattern of the display data and in some cases cannot sufficiently reduce power consumption.

Further, although the display driving apparatus disclosed by the Patent Reference 2 can suppress the EMI by reducing the peak current, power consumption is not reduced. Further, the EMI is preferably reduced more than the reduction by the display driving apparatus disclosed by the Patent Reference 2.

SUMMARY OF THE INVENTION

In view of the foregoing, an object of the present invention is to provide a display driving apparatus, a display module package, a display panel module, and a television set, which can lower power consumption and reduce the EMI.

In order to achieve the object described above, a display driving apparatus which outputs n drive signals to n display output terminals in a predetermined cycle according to n pixel data included in display data for a single line, n being an integer equal to or greater than two, and each of the n drive signals driving a panel electrode, the display driving apparatus includes: n level shift units corresponding to the n pixel data and the n display output terminals in a one-to-one relationship, and configured to shift a voltage level of corresponding pixel data and output one of a first potential and a second potential, the n level shift units; a step potential providing unit configured to provide a step potential which is between the first potential and the second potential; a change judgment unit configured to judge whether or not each of the n pixel data has changed from pixel data of an immediately previous cycle; a delay unit configured to generate n timing signals based on a horizontal synchronization signal that synchronizes with the cycle, the n timing signals corresponding to the n display output terminals in a one-to-one relationship and changing with different timings; and a control unit configured to perform control such that the display output terminal corresponding to the pixel data judged to have changed by the change judgment unit is provided with: the step potential provided by the step potential providing unit during a first time period included in each of the cycle; and the first potential or the second potential outputted from the corresponding level shift unit during a second time period that is contained in the cycle, subsequent to the first time period, and different between the display output terminals and is based on a timing of change of the corresponding timing signal.

According to the structure, the display driving apparatus according to the present invention performs two-step voltage driving which first drives the display output terminal to the step potential, and then drives the display output terminal to the first potential or the second potential (an H level or an L level). With the above structure, the display driving apparatus according to the present invention can reduce power consumption.

Further, in the display driving apparatus according to the present invention, since the step potential is provided by the step potential providing unit, the display output terminal is provided with the same potential without exception during the first time period without depending on a pattern of display data. With the above structure, the display driving apparatus according to the present invention can reduce power consumption more compared to the technique disclosed by the Patent Reference 1.

Further, the display driving apparatus according to the present invention drives the n display output terminals with different timings. With the above structure, the display driving apparatus according to the present invention can lower a peak current, thereby reducing the EMI.

Further, the display driving apparatus may further include: n latch units corresponding to the n pixel data in a one-to-one relationship, and configured to hold the corresponding pixel data with a timing based on the horizontal synchronization signal and output the pixel data which has been held; n first switches corresponding to the n pixel data, the n level shift units, and the n display output terminals in a one-to-one relationship, each of the n first switches being connected between an output terminal of the corresponding level shift unit and the corresponding display output terminal; and n second switches corresponding to the n pixel data, the n first switches, and the n display output terminals in a one-to-one relationship, each of the n second switches being connected between an output terminal of the step potential providing unit and the corresponding display output terminal, and in the display driving apparatus, the control unit may keep the first switch off and keep the second switch on during the first time period, and keep the second switch off and keep the first switch on during the second time period based on the timing of change of the corresponding timing signal, each of the first switch and the second switch corresponding to the pixel data judged to have changed by the change judgment unit.

Further, the delay unit may generate the n timing signals by providing the horizontal synchronization signal with a delay that is different for each timing signal, and the control unit may keep the n first switches off and keep the n second switches on during the first time periods that are different from one another and based on the timing of change of the n timing signals.

According to the structure, the display driving apparatus according to the present invention drives the n display output terminals to the step potential from the first potential or the second potential with different timings, and drives the n display output terminals to the first potential or the second potential from the step potential with different timings. With the above structure, the display driving apparatus according to the present invention can lower the peak current of both the driving to the step potential and the driving to the first potential and the second potential from the step potential, and thus it is possible to further reduce the EMI.

Further, the control unit may keep the n first switches off and keep the n second switches on during the same first time period based on the timing of change of the horizontal synchronization signal.

Further, the control unit may include a first control unit which generates a first signal and a second signal based on the horizontal synchronization signal and keep the n second switches on by using the second signal during the same first time period, the second signal causing the n second switches to be turned on or off, the delay unit may generate the n timing signals by providing the first signal with a delay that is different for each timing signal, each of the n timing signals changing with a different timing, and the control unit may further include a second control unit which keeps the n first switches on based on the n timing signals during the second time periods that are different from one another and start at different times.

According to the structure, the display driving apparatus according to the present invention can share the first control unit that controls the first time period in which the step potential is provided for the n display output terminals. With the above structure, the display driving apparatus according to the present invention can reduce the circuit size.

Further, the control unit may keep the corresponding second switch off and keep the corresponding first switch on during the first time period and the second time period in the case where the change judgment unit judges that the pixel data held by the corresponding latch unit has not changed.

According to this structure, the two-step voltage driving is performed only on the display output terminals of which the pixel data changes. With the above structure, the display driving apparatus according to the present invention can efficiently reduce power consumption.

Further, the step potential may be a potential that is a midpoint of the first potential and the second potential.

According to this structure, it is possible to reduce power consumption most effectively by setting the step potential as the midpoint potential of the first potential and the second potential.

Further, the delay unit may include n-1 delay elements connected in series, and the n timing signals include n-1 signals outputted from each of the n-1 delay elements.

According to this structure, it is possible to easily generate the n timing signals each of which changes with a different timing.

Further, the delay unit may generate the n timing signals such that a delay becomes greater in an order of an arrangement of the display output terminals, the n timing signals corresponding to the n display output terminals in a one-to-one relationship.

According to this structure, it is possible to reduce the area of wiring for connecting the plural delay elements.

Further, the delay unit may include a plurality of delay elements connected in a tree structure.

According to this structure, it is possible to reduce the number of stages of the delay elements through which signals pass from input to output. With this, the delay unit can reduce a cumulative delay time (the greatest delay time) of the n timing signals.

Further, the control unit may keep the corresponding first switch and second switch not to be concurrently on.

According to this structure, the display driving apparatus according to the present invention can avoid an instantaneous data conflict without fail. With this, the display driving apparatus according to the present invention can reduce the EMI without fail.

Further, the control unit may perform control such that the first switch is turned on after the second switch corresponding to the first switch is tuned off whenever the first switch is turned on, and that the second switch is turned on after the first switch corresponding to the second switch is turned off whenever the second switch is turned on.

It is to be noted that the present invention can also be realized as a display driving method including the characteristic components included in the display driving apparatus, as its steps. It is to be noted that the present invention can also be realized as a display module package, display panel module, and a television set which include such a display driving apparatus.

As described above, the present invention can present the display driving apparatus, the display module package, the display panel module, and the television set which can reduce power consumption and suppress the EMI.

FURTHER INFORMATION ABOUT TECHNICAL BACKGROUND TO THIS APPLICATION

The disclosure of Japanese Patent Application No. 2008-134379 filed on May 22, 2008 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

Embodiments of a display driving apparatus according to the present invention will be described in detail below with reference to the drawings.

FIRST EMBODIMENT

A display driving apparatus according to a first embodiment of the present invention performs two-step voltage driving on plural display output terminals with different timings. Further, the display driving apparatus according to the first embodiment of the present invention is provided with a step potential providing circuit that provides a step potential. According to the above structure, the display driving apparatus according to the first embodiment of the present invention can reduce power consumption and suppress the EMI.

First, a structure of the display driving apparatus according to the first embodiment of the present invention will be described.

Figure 1:
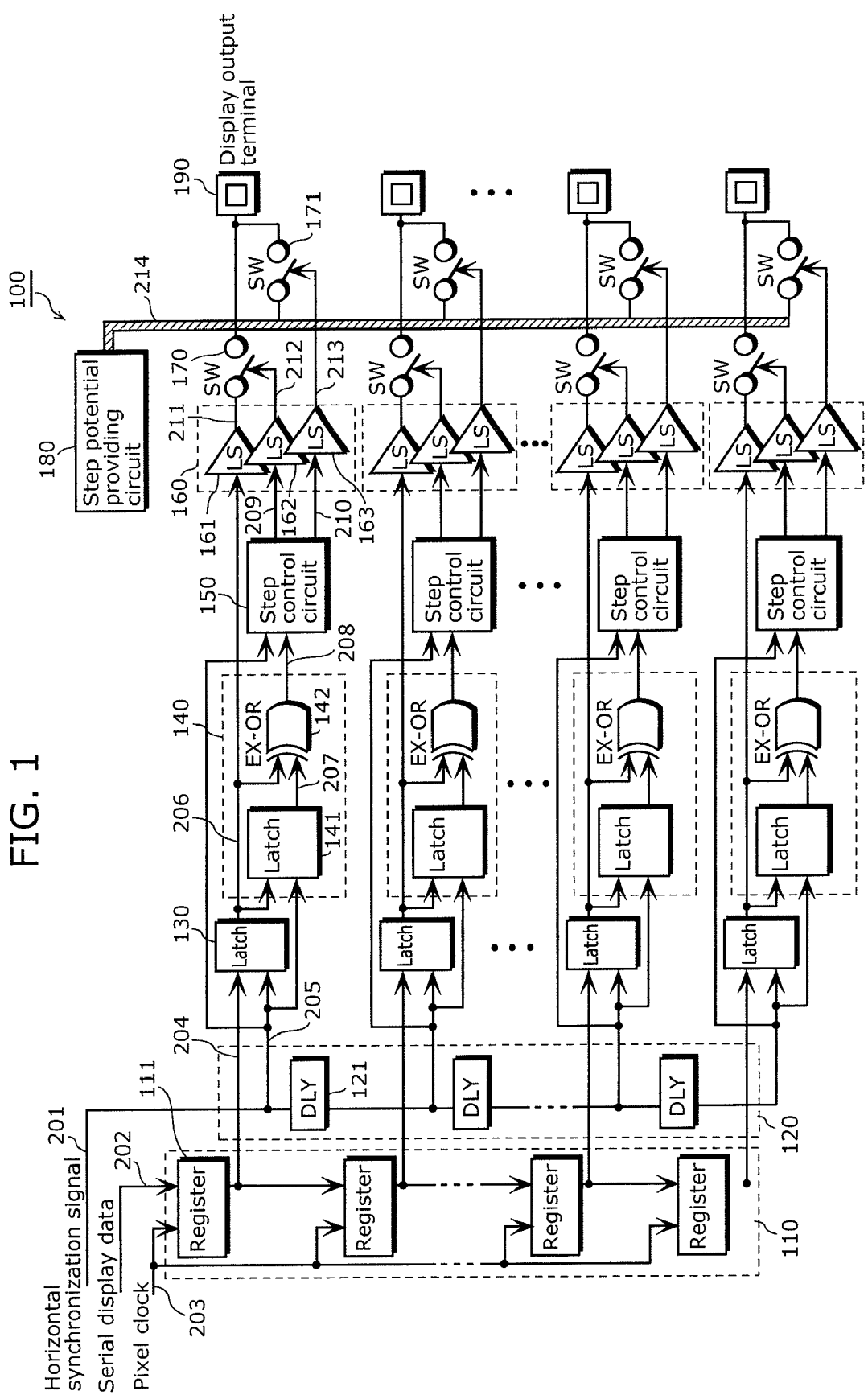
FIG. 1 is a diagram which illustrates a structure of a display driving apparatus according to a first embodiment of the present invention.

FIG. 1 is a block diagram which illustrates a structure of the display driving apparatus according to the first embodiment of the present invention.

The display driving apparatus 100 as illustrated in FIG. 1 receives n pixel data (n is an integer equal to or greater than two, for example, 192 or 388) contained in serial display data 202 for a single horizontal line, in a predetermined cycle, and outputs, according to the received n pixel data, n drive signals to n display output terminals 190, each of the n drive signals driving a panel electrode (data electrode) of a PDP.

The display driving apparatus 100 includes: a shift register 110; a delay circuit 120; n first latch circuits 130; n change judgment circuits 140; n step control circuits 150; n level shift circuits 160; n first switches 170; n second switches 171; a step potential providing circuit 180; and n display output terminals 190.

Further, the display driving apparatus 100 receives from outside a horizontal synchronization signal 201, serial display data 202, and a pixel clock 203.

The shift register 110 receives serial display data 202 for a single horizontal line using the pixel clock 203 and outputs the received serial display data 202 in parallel.

The serial display data 202 is a display data signal inputted serially from outside in order to drive the data electrode of the PDP. The serial display data 202 includes n pixel data 204 each corresponding to one of the pixels.

The shift register 110 includes n registers 111. The n registers 111 are connected in series. The n registers 111 store and output n pixel data 204, respectively.

The pixel clock 203 is a clock inputted in synchronization with the serial display data 202. The pixel clock 203 is a clock for storing pixel data 204 inputted serially into one of the registers 111 and sequentially shifting the pixel data 204 stored in the register 111 to the other register 111 in the next stage. More specifically, the pixel clock 203 is a clock for storing the serial display data 202 for a single horizontal line into the shift register 110.

The shift register 110 receives the serial display data 202 for every pixel clock 203 and sequentially shifts the received pixel data 204 to store the serial display data 202 for a single horizontal line.

The delay circuit 120 delays the horizontal synchronization signal 201, thereby generating n latch control signals 205 each of which changes with a different timing.

The horizontal synchronization signal 201 is a synchronization signal that is inputted with respect to each cycle of line data change (hereinafter also simply referred to as "cycle") of the serial display data 202 inputted from outside.

The delay circuit 120 includes n-1 delay elements 121. The n-1 delay elements 121 are connected in series. The horizontal synchronization signal 201 and the n-1 signals outputted from each of the delay elements 121 connected in series are n latch control signals 205. Further, a delay amount of each of the n-1 delay elements 121 is the same. For example, the delay amount of a single delay element 121 is 0.2n seconds, approximately. It is to be noted that at least one of the n-1 delay elements 121 may have a different delay amount.

Further, the delay elements 121 delay n latch control signals 205 so that a delay becomes greater in the order of an arrangement of the display output terminals 190 (for example, in a direction from top to bottom in FIG. 1).

It is to be noted that each of the display output terminals 190 is associated with a corresponding one of the registers 111, a corresponding one of the latch control signals 205, a corresponding one of the latch circuits 130, a corresponding one of the change judgment circuits 140, a corresponding one of the step control circuits 150, a corresponding one of the level shift circuits 160, a corresponding one of the first switches 170, and a corresponding one of the second switches 171, as illustrated in FIG. 1. It is assumed that descriptions below indicate operations for each corresponding structural element unless particular descriptions are provided. Further, since the structure of each element corresponding to one of the display output terminals 190 is the same as the structure of each element corresponding to any other display output terminals 190, only the structural elements corresponding to one of the display output terminals 190 will be described as a representation.

The latch circuit 130 receives and holds pixel data 204 stored in the register 111 with a timing that a latch control signal 205 changes, and outputs the held pixel data 206.

The change judgment circuit 140 judges whether or not the pixel data 206 held in the latch circuit 130 has changed from the pixel data 206 held in an immediately preceding cycle. The change judgment circuit 140 includes a latch circuit 141 and an exclusive OR circuit 142.

The latch circuit 141 holds the pixel data 207 that has been held in the latch circuit 130 in the immediately preceding cycle. The latch circuit 141 receives and holds the pixel data 206 outputted from the latch circuit 130 with a timing that the latch control signal 205 changes, and outputs the held pixel data 207. It is to be noted that the latch circuit 141 holds the pixel data 206 using a signal that changes with the same timing as or an earlier timing than the latch control signal 205 inputted into the latch circuit 130.

The exclusive OR circuit 142 judges whether or not the pixel data 206 held in the latch circuit 130 and the pixel data 207 held in the latch circuit 141 are the same and outputs a judgment signal 208 that indicates a result of the judgment. In other words, the exclusive OR circuit 142 judges whether or not the pixel data 206 held in the latch circuit 130 has been changed due to a line data change. More specifically, the exclusive OR circuit 142 judges that the pixel data 206 has not been changed due to a line data change when the pixel data 206 and the pixel data 207 are the same, and that the pixel data 206 has been changed due to a line data change when the pixel data 206 and the pixel data 207 are different.

The step control circuit 150 generates, based on a latch control signal 205, a first switch control signal 209 that turns a first switch 170 on or off and a second switch control signal 210 that turns a second switch 171 on or off.

The level shift circuit 160 includes level shifters 161, 162, and 163.

The level shifters 161, 162, and 163 convert a voltage level of an inputted signal and output the signal having a converted voltage level. For example, the shift register 110, the delay circuit 120, the latch circuit 130, the change judgment circuit 140, and the step control circuit 150 operate at a power supply voltage of 3V (0V of the L level, 3V of the H level), and the level shifters 161, 162, and 163 output a signal having 0V of the L level and 85V of the H level by shifting a voltage level of a logic of the pixel data 206 (the L level or the H level).

The level shifter 161 outputs the pixel data 211 by shifting a voltage level of the pixel data 206 held in the latch circuit 130. The level shifter 162 outputs a first switch control signal 212 by shifting a voltage level of a first switch control signal 209. The level shifter 163 outputs a second switch control signal 213 by shifting a voltage level of a second switch control signal 210.

The step potential providing circuit 180 provides a step potential 214 of VDD/2. Here, VDD is a potential of the H level (for example, 85V) after converted by the level shift circuit 160.

A first switch 170 is connected between an output terminal of the level shifter 161 and a display output terminal 190.

A second switch 171 is connected between the display output terminal 190 and a common line through which the step potential 214 is provided by the step potential providing circuit 180. Here, the common line through which the step potential 214 is provided by the step potential providing circuit 180 is connected to all of the n second switches 171.

For example, both of the first switch 170 and the second switch 171 are a P channel metal-oxide semiconductor field-effect transistor (MOSFET).

The step control circuit 150 controls the step potential 214 that is provided by the step potential providing circuit 180 to be provided to the display output terminal 190 during a first period that is different between the display output terminals 190 in the case where the change judgment circuit 140 judges that the pixel data 206 has been changed. The step control circuit 150 controls the H level or L level potential outputted from the level shifter 161 to be provided to the display output terminal 190 during a second period that is subsequent to the first period and is different between the display output terminals 190.

More specifically, the step control circuit 150 keeps the first switch 170 off and the second switch 171 on during the first periods that are different from one another and based on a timing of change of the n latch control signals 205. Subsequently, the step control circuit 150 keeps the second switch 171 off and the first switch 170 on during the second periods that are different from one another and based on a timing of change of the n latch control signals 205.

This causes the display output terminal 190 to be temporarily provided with the step potential 214 by the step potential providing circuit 180. Subsequently, the display output terminal 190 is driven to the H level or the L level potential by the level shifter 161.

Further, step control circuit 150 controls the H level or the L level potential outputted to the display output terminal 190 by the level shifter 161 to be provided to the display output terminal 190 during the first period and the second period in the case where the change judgment circuit 140 judges that the pixel data 206 has not been changed.

More specifically, the step control circuit 150 keeps the second switch 171 off and keeps the first switch 170 on during the first period and the second period.

With this, the display output terminal 190 is not provided with the step potential 214 and is provided with the H level or the L level potential by the level shifter 161 in the case where the pixel data 206 has not been changed.

Further, the step control circuit 150, for n sets of the first switch 170 and the second switch 171, keep the first switch 170 off and the second switch 171 on during the first periods that are different from one another, and keeps the second switch 171 off and the first switch 170 on during the second periods that are different from one another.

Figure 2:
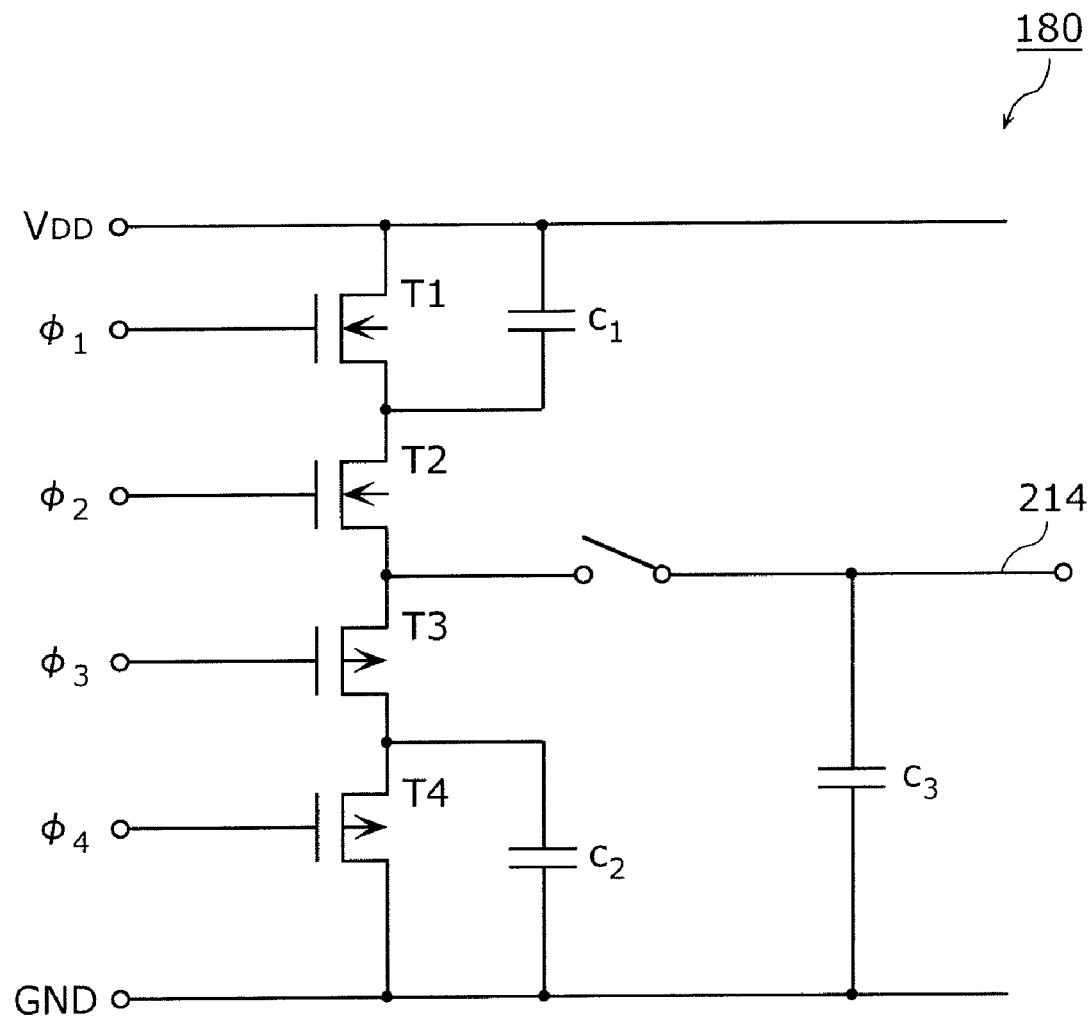
FIG. 2 is a circuit diagram which illustrates a structure of a step potential providing circuit according to the first embodiment of the present invention.

FIG. 2 is a diagram which illustrates a circuit structure of the step potential providing circuit 180.

In the circuit structure as illustrated in FIG. 2, a step potential 214 of VDD/2 is generated by: inputting a clock signal $\phi 1$ into a gate of the transistor T1; inputting a clock signal $\phi 2$ that is the same cycle as and has a phase shifted by 180 degrees from the clock signal $\phi 1$ into a gate of the transistor T2; inputting a clock signal $\phi 3$ that is an inversion signal of a signal having a cycle twice as large as the clock signal $\phi 2$ into a gate of the transistor T3; inputting a clock signal $\phi 4$ that is an inversion signal of the clock signal $\phi 1$ into a gate of the transistor T4.

Further, it is possible to provide VDD/2 with smaller power consumption by using the step potential providing circuit 180 that has the circuit structure as illustrated in FIG. 2.

Next, an outline of an operation of the display driving apparatus 100 will be described.

Figure 3:
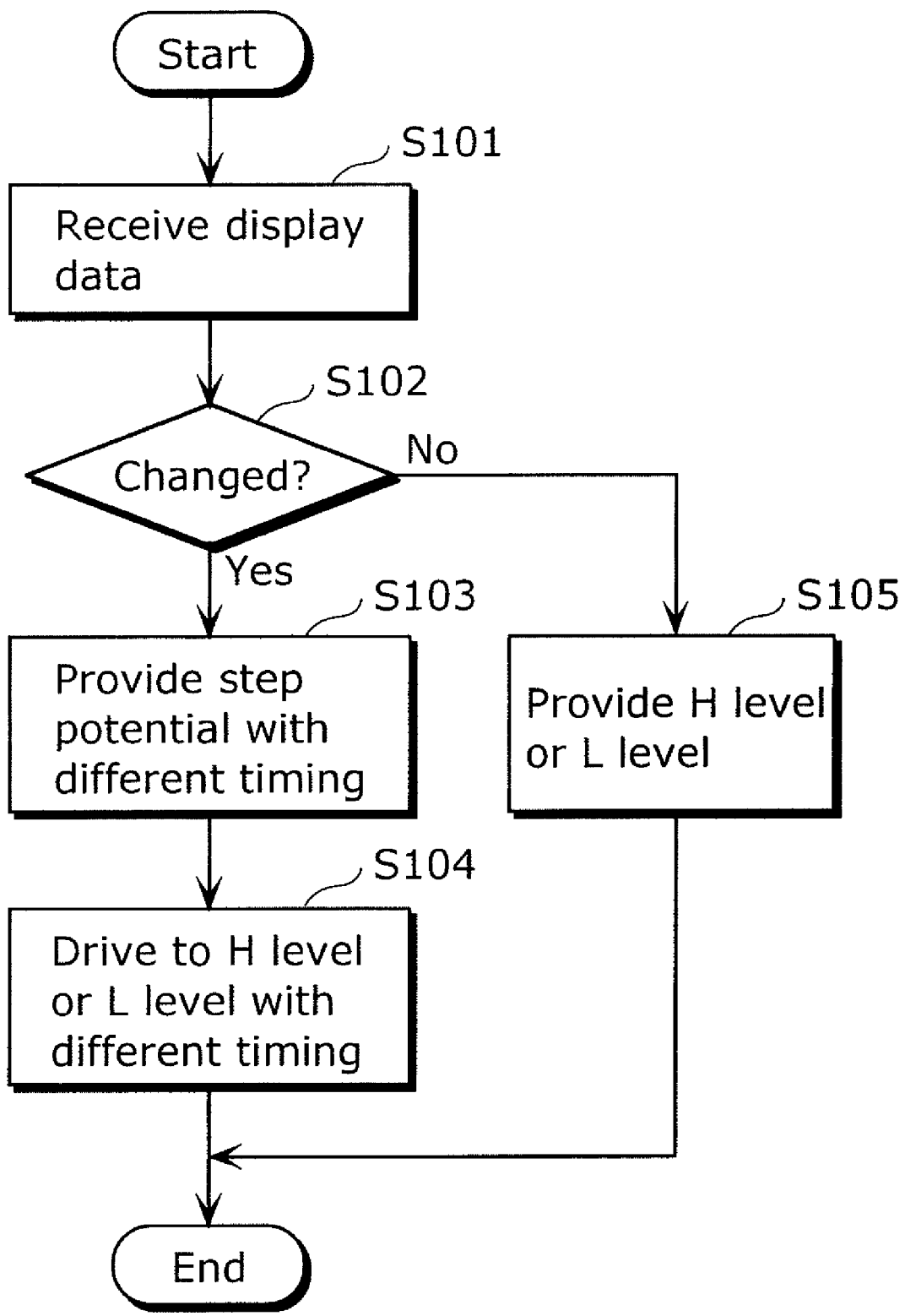
FIG. 3 is a flowchart which illustrates a flow of operations of the display driving apparatus according to the first embodiment of the present invention.

FIG. 3 is a flowchart which illustrates an operational flow of the display driving apparatus 100.

First, the serial display data 202 is stored in the shift register 110.

Next, the latch circuit 130 holds, as the pixel data 206, the pixel data 204 held in the register 111 with a timing of change of the latch control signal 205 (S101).

The change judgment circuit 140 judges whether or not the pixel data 206 held by the latch circuit 130 has changed (S102).

In the case where the pixel data 206 has changed (Yes, in S102), the step control circuit 150 turns the first switch 170 off and the second switch on, thereby providing the display output terminal 190 with the step potential 214. Here, the n step control circuits 150, based on the latch control signal 205 that changes with a different timing, starts providing the display output terminal 190 with the step potential 214 with a different timing (S103).

Next, the step control circuit 150, after the potential of the display output terminal 190 becomes the step potential 214, turns the second switch 171 off and turns the first switch on, thereby driving the display output terminal 190 to the H level or the L level potential. Here, the n step control circuits 150, based on the latch control signal 205 that changes with a different timing, starts driving the display output terminal 190 to the H level or the L level potential with a different timing (S104).

On the other hand, in the case where the pixel data 206 has not changed (No, in S102), the step control circuit 150 turns the second switch 171 off and turns the first switch 170 on, thereby driving the display output terminal 190 to the H level or the L level potential (S105).

It is to be noted that the processes as illustrated in FIG. 3 are performed by each structural element corresponding to each of the display output terminals 190.

An example of operations of the display driving apparatus 100 will be described in detail below.

Figure 4:
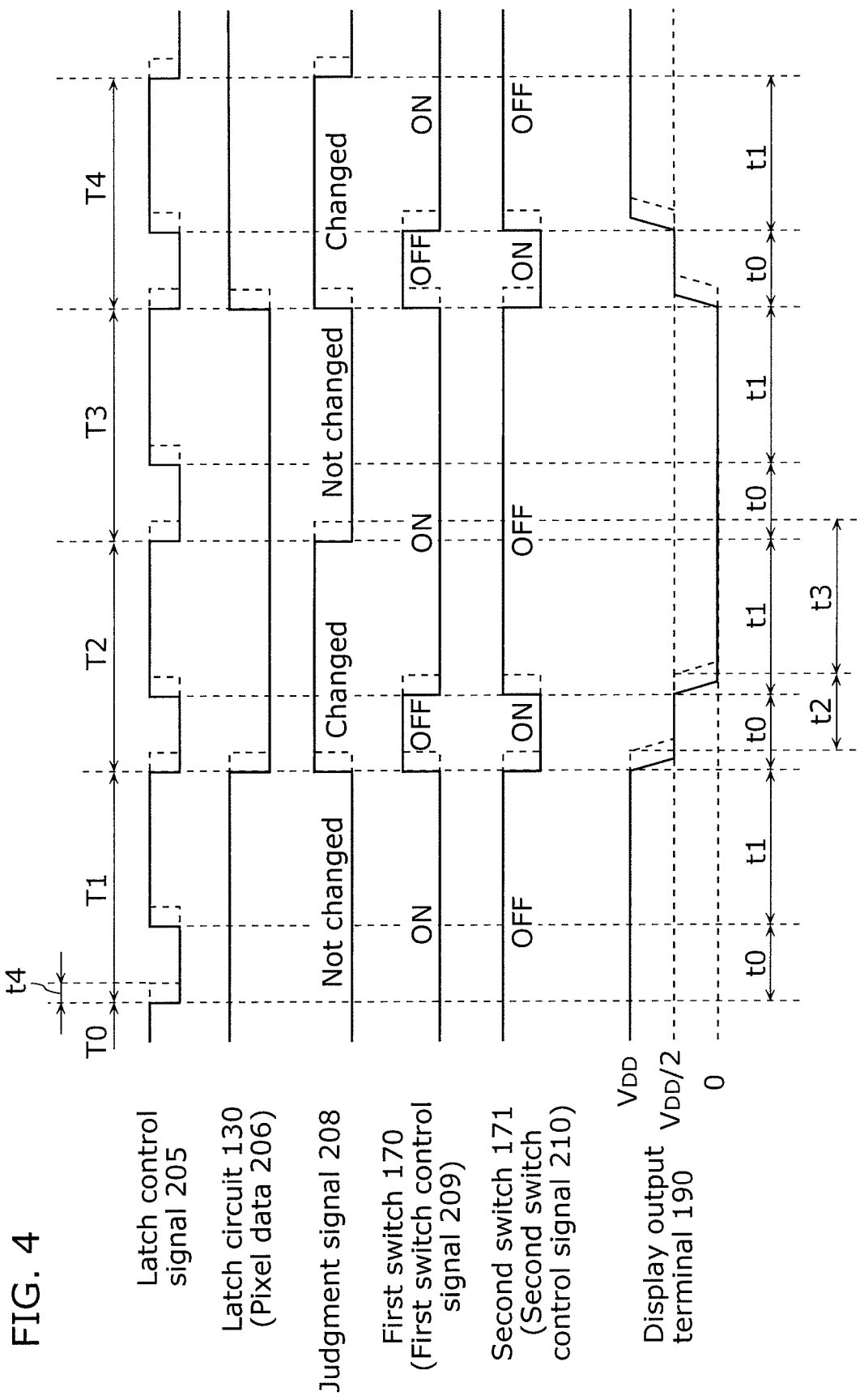
FIG. 4 is a timing diagram which illustrates operations of the display driving apparatus according to the first embodiment of the present invention.

FIG. 4 is a flowchart which illustrates operations of the display driving apparatus 100.

In T0 which is a cycle of line data change, the latch circuit 130 holds the pixel data 206 of the H level and a potential of the H level is outputted to the display output terminal 190.

In a cycle T1, the pixel data 204 is at the H level and the pixel data 206 held by the latch circuit 130 remains the same. Accordingly, the step control circuit 150 keeps the second switch 171 off and keeps the first switch 170 on during a first time period t0 and a second time period t1. The above structure causes the display output terminal 190 to maintain the H level (VDD) provided by the level shifter 161.

In a cycle T2, the pixel data 204 is at the L level and the pixel data 206 held by the latch circuit 130 changes from the H level to the L level.

Accordingly, the step control circuit 150 keeps the first switch 170 off and keeps the second switch 171 on during a first time period t0. The above structure causes the display output terminal 190 to be provided with a step potential 214 (VDD/2) by the step potential providing circuit 180, so that the potential of the display output terminal 190 changes from the H level (VDD) to the step potential 214 (VDD/2).

Further, the step control circuit 150 keeps the second switch 171 off and keeps the first switch 170 on during the second time period t1. The above structure causes the display output terminal 190 to be provided with the L level (0V) by the level shifter 161 during the second time period t1, so that the potential of the display output terminal 190 changes from the step potential 214 (VDD/2) to the L level (0V).

In a cycle T3, the pixel data 204 is at the L level and the pixel data 206 held by the latch circuit 130 remains the same. Accordingly, the step control circuit 150 keeps the second switch 171 off and keeps the first switch 170 on during the first time period t0 and the second time period t1. The above structure causes the display output terminal 190 to maintain the L level (0V) provided by the level shifter 161.

In a cycle T4, the pixel data 204 is at the H level and the pixel data 206 held by the latch circuit 130 changes from the L level to the H level.

Accordingly, the step control circuit 150 keeps the first switch 170 off and keeps the second switch 171 on during the first time period. The above structure causes the display output terminal 190 to be provided with the step potential 214 (VDD/2) by the step potential providing circuit 180 during the first time period t0, so that the potential of the display output terminal 190 changes from the L level (0V) to the step potential 214 (VDD/2).

Further, the step control circuit 150 keeps the second switch 171 off and keeps the first switch 170 on during the second time period t1. The above structure causes the display output terminal 190 to be provided with the H level (VDD) by the level shifter 161 during the second time period t1, so that the potential of the display output terminal 190 changes from the step potential 214 (VDD/2) to the H level (VDD).

As described above, the display driving apparatus 100 according to the first embodiment of the present invention drives the display output terminal 190 in two steps in the case where the pixel data 206 changes. This structure allows the display driving apparatus 100 to reduce power consumption.

The principle of which power consumption is reduced by driving in two steps will be described below.

It is generally known that power consumption is proportional to (operating frequency)×(drive load capacity)×(drive voltage)$^2$. Here, in the case where the operating frequency (data transition cycle change time) is assumed to be constant, power consumption is proportional to (drive load capacity)×(drive voltage)$^2$.

Power consumption in the case where two-step drive is not used is expressed as $Pm \propto Cm \times Vm^2$, where Pm is power consumption of an arbitrary drive terminal, Cm is total load capacity, and Vm is drive voltage amplitude.

On the other hand, when the step potential is assumed to be ½ Vm, power consumption in the case where drive is performed in two steps (two divisions) is shown by the expression (1) below.

$$Pm \propto Cm \times (Vm/2)^2 \times 2 \text{ (the number of times of division drive)} = \tfrac{1}{2} \times Cm \times (Vm)^2 \quad \text{Expression (1)}$$

As described above, the power consumption can be reduced to ½ by driving in two steps.

Further, when the step potential is assumed to be ⅓ and ⅔ Vm, the power consumption when drive is performed in three steps (three divisions) is shown by the expression (2) below.

$$Pm \propto Cm \times (Vm/3)^2 \times 3 = \tfrac{1}{3} \times Cm \times (Vm)^2 \quad \text{Expression (2)}$$

Similarly, when the step potential is assumed to be a potential that Vm is divided into n equal parts, power consumption when drive is performed in n (n is an integer equal to or greater than two) steps (n divisions) is shown by the expression (3) below.

$$Pm \propto 1/n \times Cm \times (Vm)^2 \quad \text{Expression (3)}$$

The power consumption can be reduced by increasing steps of division drive as shown in the above Expression (3).

Further, when comparing the case where the step potential is a midpoint potential (Vm/2) to the case where the step potential is not the midpoint potential, the Expression (1) shows that the power consumption can be reduced more in the case where the step potential is the midpoint potential of Vm, even when the drive is performed in two steps in both of the cases.

Further, with the display driving apparatus 100 according to the first embodiment of the present invention, since the step potential 214 is provided to the display output terminal 190 by the step potential providing circuit 180, the display output terminal 190 of which the pixel data 206 changes is constantly VDD/2 without depending on a pattern of the serial display data 202 during the first time period t0. More specifically, the display driving apparatus 100 according to the first embodiment of the present invention can constantly provide the step potential 214 that can reduce power consumption most efficiently, without depending on the pattern of the serial display data 202. Therefore, the display driving apparatus 100 according to the first embodiment of the present invention can reduce consumption current more reliably than in the case where the step potential depends on the pattern of the serial display data 202 as in the display driving apparatus disclosed in the Patent Reference 1.

Further in FIG. 4, potentials of the latch control signal 205, the pixel data 206, the judgment signal 208, the first switch control signal 209, the second switch control signal 210 and the display output terminal 190 are shown by dashed lines, each of the latch control signal 205, the pixel data 206, the judgment signal 208, the first switch control signal 209, and the second switch control signal 210 corresponding to a different display output terminal 190.

As illustrated in FIG. 4, the latch control signal 205 corresponding to a different display output terminal 190 changes with a timing delayed from the signal shown by the solid lines by a delay time t4 provided in the delay circuit 120. The above structure causes the timing of change of the potential of the pixel data 206, the judgment signal 208, the first switch control signal 209, the second switch control signal 210 and the display output terminal 190 to be delayed by the delay time t4.

More specifically, the step control circuit 150 keeps the first switch 170 off and the keeps the second switch 171 on during a first time period t2 that is delayed from the first time period t0 by the delay time t4. Further, the step control circuit 150 keeps the second switch 171 off and the keeps the first switch 170 on during a second time period t3 that is delayed from the second time period t1 by the delay time t4.

Further, n latch control signals 205 are provided with delay times t4 which are different from each other by the delay circuit 120.

More specifically, the display driving apparatus 100 keeps the first switch 170 off and keep the second switch 171 on during the first time periods t0 and the t2 each of which starts from a different time based on the timing of change of the n latch control signals 205. Further, the display driving apparatus 100 keeps the second switch 171 off and keep the first switch 170 on during the second time period t1 and the t3 each of which starts from a different time based on the timing of change of the n latch control signals 205. Accordingly, the display output terminal 190 is driven by the step potential providing circuit 180 and the level shifter 161 with different timings.

With this, the display driving apparatus 100 according to the first embodiment of the present invention can lower peak current, thereby reducing the EMI when the serial display data 202 changes.

Further, since the drive timing is different for every display output terminal 190, it is possible to reduce the EMI more efficiently compared to the display driving apparatus disclosed by the Patent Reference 2.

A structure of the step control circuit 150 will be described in detail below.

Figure 5:
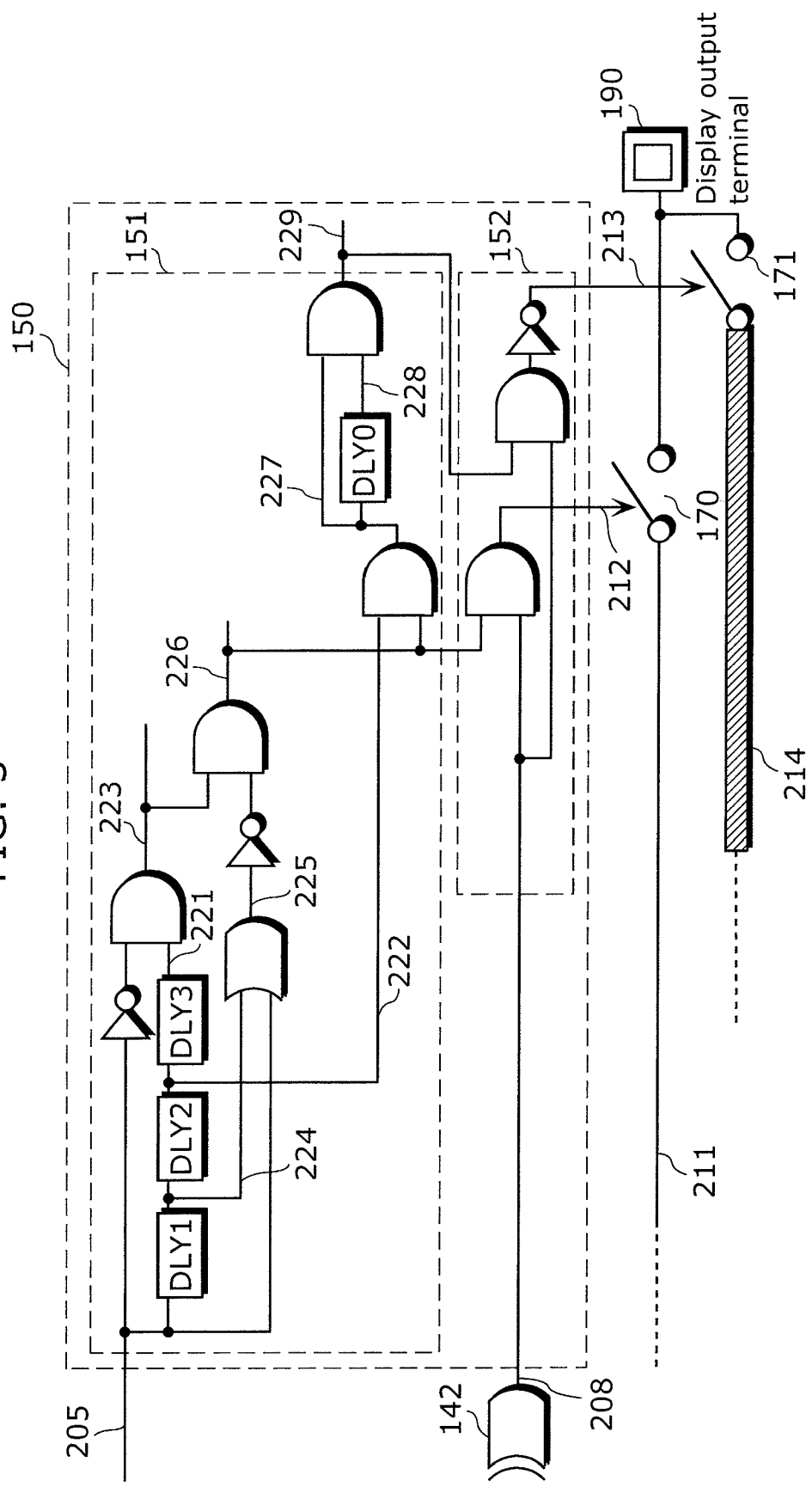
FIG. 5 is a circuit diagram which illustrates a structure of a step control circuit according to the first embodiment of the present invention.

FIG. 5 is a diagram which illustrates a circuit structure of the step potential providing circuit 150. The step control circuit 150 includes a timing generation unit 151 and a change control unit 152.

It is to be noted that the level shifters 162 and 163 are omitted in FIG. 5.

The timing generation unit 151 generates a signal 226 and a signal 229 using the latch control signal 205. The signal 226 and the signal 229 are original signals of the first switch control signal 212 and the second switch control signal 213, respectively.

In the case where the pixel data 206 is judged to have changed due to a line data change (the case where the judgment signal 208 is at the L level), the change control unit 152 causes the first switch control signal 212 to be the L level and the second switch control signal 213 to be the H level constantly without depending on the logic of the signal 226 and the signal 229. In other words, the first switch 170 is turned on and the second switch 171 is turned off.

Figure 6:
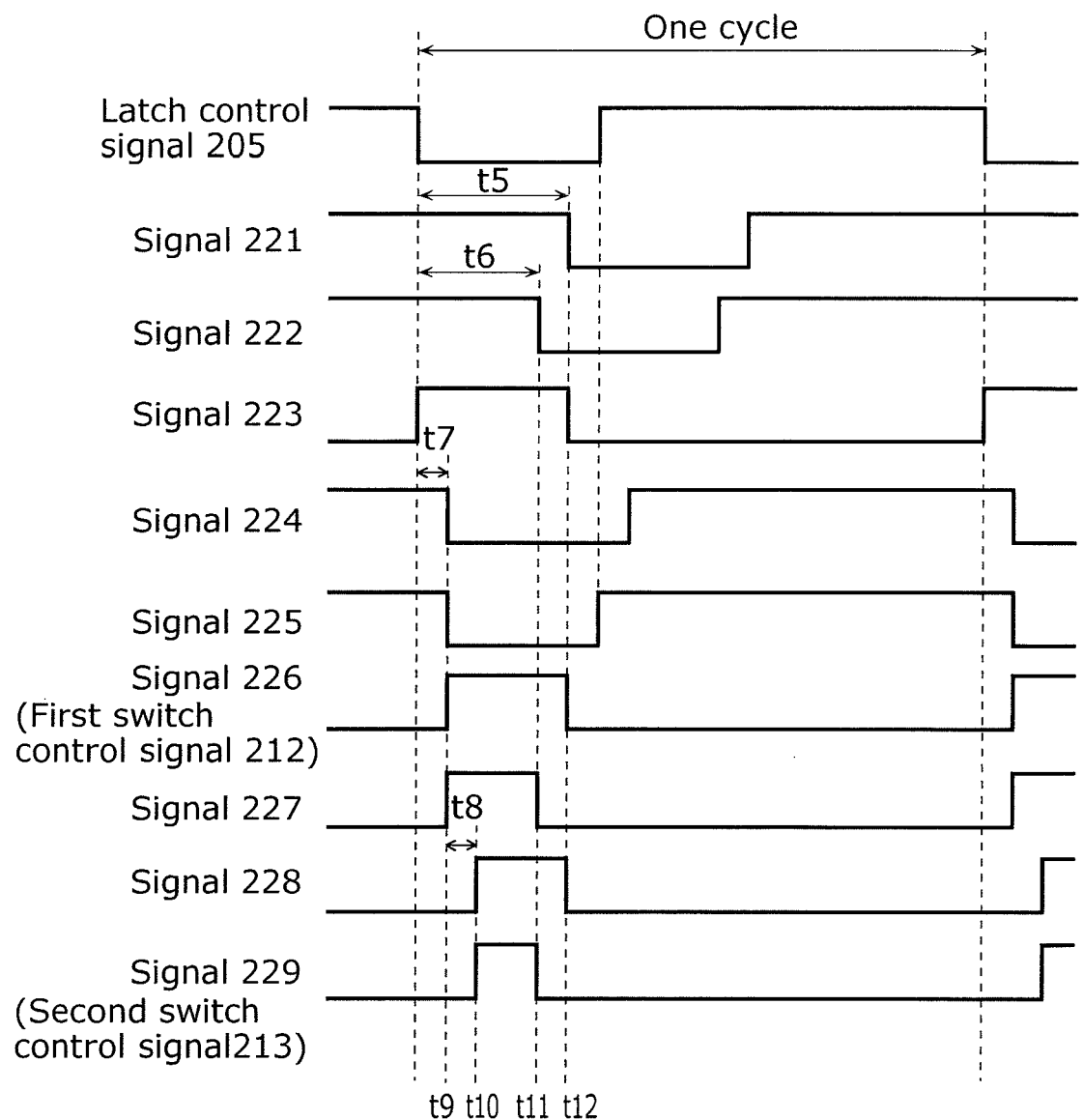
FIG. 6 is a timing diagram which illustrates operations of the step control circuit according to the first embodiment of the present invention.

FIG. 6 is a timing chart which illustrated an operation for one cycle of the timing generation unit 151.

In FIG. 6, a time t5 is a sum of delay time of delay elements DLY1, DLY2, and DLY3, a time t6 is a sum of delay time of delay elements DLY1 and DLY2, a time t7 is a delay time of delay element DLY1, and a time t8 is a delay time of delay element DLY0. Further, each of the delay time of the delay element DLY0 and DLY1 is smaller than the delay time of the delay element DLY2.

Further, the signal 226 is an original signal of the first switch control signal 212. The first switch 170 turns off when the signal 226 is at the H level, and the first switch 170 turns on when the signal 226 is at the L level. The signal 229 is an original signal of the second switch control signal 213. The second switch 171 turns on when the signal 229 is at the H level, and the second switch 171 turns off when the signal 229 is at the L level As shown in FIG. 6, when the state where the first switch 170 is on and the second switch 171 is off changes to the state where the first switch 170 is off and the second switch 171 is on, the first switch 170 is turned off at the time t9 and the second switch 171 is turned on at the time t10. In other words, both of the first switch 170 and the second switch 171 are kept off from the time t9 through the t10.

Further, when the state where the first switch 170 is off and the second switch 171 is on changes to the state where the first switch 170 is on and the second switch 171 is off, the second switch 171 is turned off at the time t11 first, and then the first switch 170 is turned on at the time t12. In other words, both of the first switch 170 and the second switch 171 are kept off from the time t11 through the time t12.

In other words, the timing generation unit 151 turns the first switch 170 on after turning the second switch 171 off whenever turning the first switch 170 on. Further, the timing generation unit 151 turns the second switch 171 on after turning the first switch 170 off whenever turning the second switch 171 on. In other words, the timing generation unit 151 keeps the first switch 170 and the second switch 171 not to be on at the same time.

With this, in the display driving apparatus 100 according to the first embodiment of the present invention, the first switch 170 and the second switch 171 are kept not to be on at the same time, so that an instantaneous data conflict can be avoided without fail. With this, the display driving apparatus 100 can reduce the EMI without fail.

As described above, in the display driving apparatus 100 according to the first embodiment of the present invention, the pixel data 206 to be outputted to plural display output terminals 190 is driven with different starting timings. With this, the display driving apparatus 100 can lower the peak current, thereby reducing the EMI noise related to display driving.

Further, when the pixel data 206 changes, the display driving apparatus 100 first drives the potential of the display output terminal 190 to the step potential 214 that is provided by the step potential providing circuit 180, and then drives to VDD or GND. More specifically, the display driving apparatus 100 drives the display output terminal 190 with two divisions using a two-step potential. Here, the power consumption is proportional to a squared potential amount to be driven. More specifically, the power consumption can be reduced to a lower level by driving the display output terminal 190 with two divisions compared to the case where the display output terminal 190 is driven from GND to VDD or from VDD to GND.

It is to be noted that the step potential 214 that is provide by the step potential providing circuit 180 is not limited to the midpoint potential of VDD and GND (VDD/2), but also sufficient to be the potential between VDD and GND. It is to be noted that, considering the effect of reducing power consumption, it is preferable that the step potential 214 is VDD/2.

Further, with the display driving apparatus 100, in the case where a transition of the pixel data 206 for plural display output terminals 190 is an inverse potential, that is, in the case where the potential of one of the display output terminals 190 changes from the L level to the H level, and the potential of the other display output terminal 190 changes from the H level to the L level, electric charges accumulated between display output terminals 190 are shared via the common line through which the step potential 214 is provided from the step potential providing circuit 180. The above structure makes it possible to reduce power consumption of the step potential providing circuit 180.

As described above, the display driving apparatus 100 can attain both lowering power consumption and lowering the EMI.

Further, with the display driving apparatus 100, since the display output terminals 190 are driven to the step potential 214 with different timings, it is possible to lower a peak of load for the step potential providing circuit 180.

SECOND EMBODIMENT

A display driving apparatus according to a second embodiment of the present invention is a modification of the display driving apparatus 100 according to the first embodiment described above. The display driving apparatus according to the second embodiment of the present invention drives the plural display output terminals 190 to a step potential with the same timing, and then to an L level or an H level with different timings.

First, a structure of the display driving apparatus according to the second embodiment of the present invention will be described.

Figure 7:
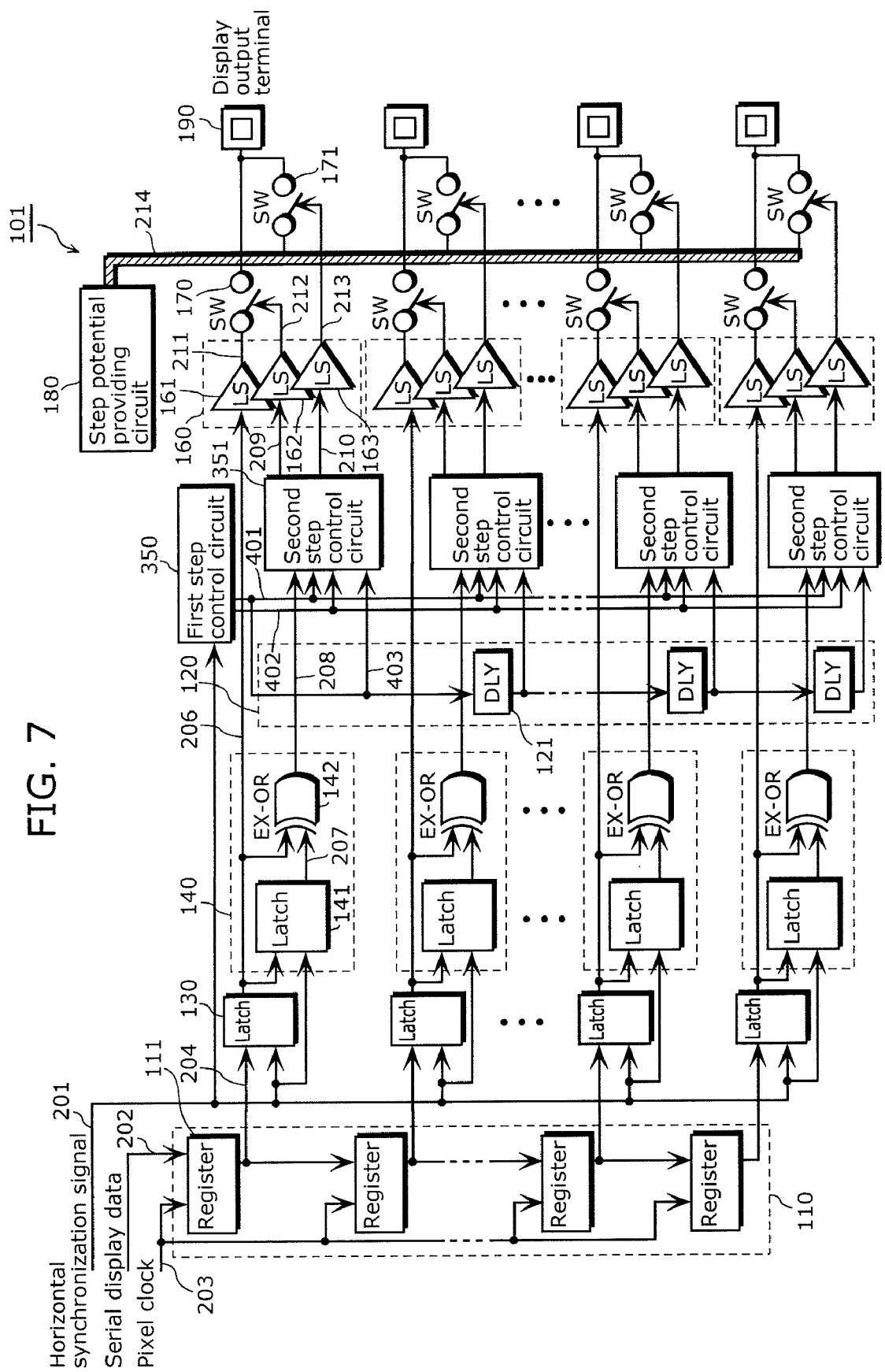
FIG. 7 is a diagram which illustrates a structure of a display driving apparatus according to a second embodiment of the present invention.

FIG. 7 is a block diagram which illustrates a structure of the display driving apparatus according to the second embodiment of the present invention. It is to be noted that the same numerals are assigned to the same elements as in FIG. 1 and the description that is overlapped will be omitted The display driving apparatus 101 as illustrated in FIG. 7 is different from the display driving apparatus 100 according to the first embodiment in that: a first step control circuit 350 and a second step control circuit 351 are provided in place of the step control circuit 150; n latch circuits 130 and n latch circuits 141 receive the pixel data 204 and 206 with a timing of change of the horizontal synchronization signal 201; and a connecting position of the delay circuit 120.

Further, since the structure of each element corresponding to one of the display output terminals 190 is the same as the structure of each element corresponding to any other display output terminals 190, only the structural elements corresponding to one of the display output terminals 190 will be described as a representation.

The latch circuit 130 receives and holds pixel data 204 stored in the register 111 with a timing that the horizontal synchronization signal 201 changes, and outputs the held pixel data 206.

The change judgment circuit 140 judges whether or not the pixel data 206 held by the latch circuit 130 has changed from the pixel data 206 held in the immediately preceding cycle. The change judgment circuit 140 includes a latch circuit 141 and an exclusive OR circuit 142.

The latch circuit 141 holds the pixel data 207 that has been held in the latch circuit 130 in the immediately preceding cycle. The latch circuit 141 receives and holds the pixel data 206 outputted from the latch circuit 130 with the timing that the horizontal synchronization signal 201 changes, and outputs the held pixel data 207. It is to be noted that the latch circuit 141 holds the pixel data 206 using a signal that changes with the same timing as or an earlier timing than the horizontal synchronization signal 201 inputted into the latch circuit 130.

The first step control circuit 350 and the second step control circuit 351 generate, base on the horizontal synchronization signal 210, a first switch control signal 209 that turns the first switch on or off and a second switch control signal 210 that turns the second switch on or off.

The first step control circuit 350 and the second step control circuit 351 keeps the n first switches 170 off and keep the n second switches 171 on during the same first time periods, and then keep the n second switches 171 off and keep the n first switches 170 on during the second time periods that are different from one another.

The first step control circuit 350 generates a signal that is commonly used for the n pixel data 206 (the display output terminal 190). The second step control circuit 351 is formed for the n pixel data 206 (the display output terminals 190).

The first step control circuit 350 generates a first timing signal 401 and a second timing signal 402 based on the horizontal synchronization signal 201. The second timing signal 402 is a signal that indicates a timing for turning the n second switches 171 on or off in the case where the pixel data 206 changes. More specifically, the first step control circuit 350 keeps the n second switches 171 on according to the second timing signal 402 during the same first time periods.

The delay circuit 120 generates n third timing signals 403 each of which changes with a different timing, by delaying the first timing signal 401. The n third timing signals 403 are signals that indicate a timing for turning the n first switches on in the case where the pixel data 206 changes.

The delay circuit 120 includes n-1 delay elements 121. The n-1 delay elements 121 are connected in series. The first timing signal 401 and n-1 signals outputted from each of the delay elements 121 connected in series correspond to the n third timing signals 403.

The second step control circuit 351 generates the first switch control signal 209 based on the third timing signals 403 and generates the second switch control signal 210 based on the second timing signals 402.

The second step control circuit 351 performs control such that a step potential 214 provided by the step potential providing circuit 180 is provided to the display output terminals 190 during a first time period that is the same between the display output terminals 190 in the case where the change judgment circuit 140 judges that the pixel data 206 has changed. The second step control circuit 351 performs control such that an H level or an L level potential outputted from the level shifter 161 is provided to the display output terminals 190 during a second time period that is subsequent to the first time period and is different from one another.

More specifically, the second step control circuit 351 keeps the first switch 170 off and the second switch 171 on during the same first time period. Then, the second step control circuit 351 keeps the second switch 171 off and the first switch 170 on based on the third timing signal 403 during the second time periods that are different from one another and start at different times. This causes the display output terminal 190 to be driven to the step potential 214 by the step potential providing circuit 180. Subsequently, the display output terminal 190 is driven to the H level or the L level potential by the level shifter 161.

Further, the second step control circuit 351 performs control so that the H level or the L level potential outputted from the level shifter 161 is provided to the display output terminals 190 during the first time period and the second time period in the case where the change judgment circuit 140 judges that the pixel data 206 has not changed.

More specifically, the second step control circuit 351 keeps second switch 171 off and the first switch 170 on during the first time period and the second time period. With this, the display output terminal 190 is not provided with the step potential 214 and is provided with the H level or the L level potential by the level shifter 161 in the case where the pixel data 206 has not changed.

Next, an outline of an operation of the display driving apparatus 101 will be described.

Figure 8:
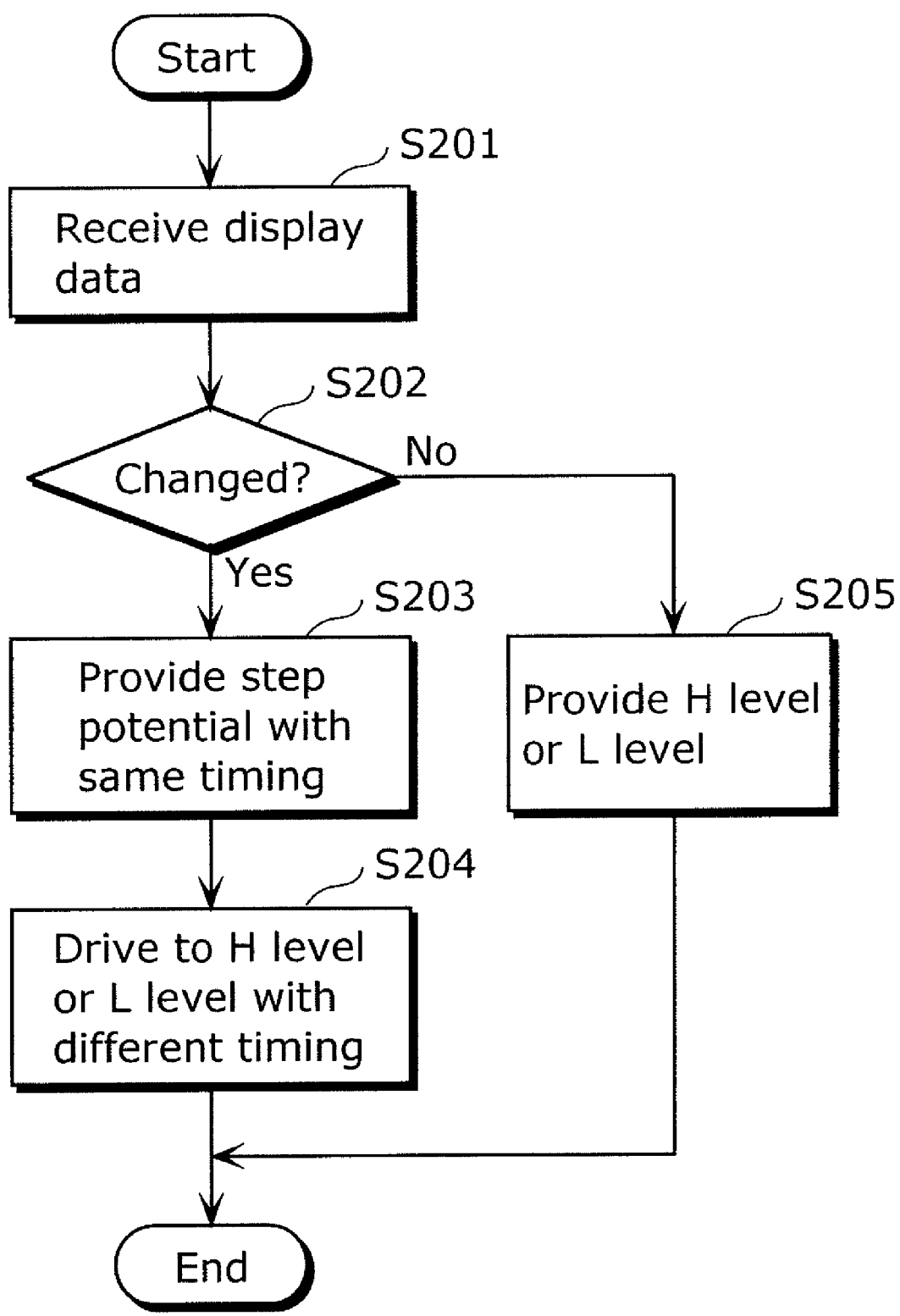
FIG. 8 is a flowchart which illustrates operations of the display driving apparatus according to the second embodiment of the present invention.

FIG. 8 is a flowchart which illustrates an operational flow of the display driving apparatus 101.

First, serial display data 202 is stored in the shift register 110.

Next, the latch circuit 130 holds the pixel data 204 held in the register 111 as the pixel data 206 with a timing of change of the horizontal synchronization signal 201 (S201).

The change judgment circuit 140 judges whether or not the pixel data 206 held by the latch circuit 130 has changed (S202).

In the case where the pixel data 206 has changed (Yes, in S202), the second step control circuit 351 turns the first switch 170 off and the second switch 171 on, thereby providing the step potential 214 to the display output terminal 190. Here, the n second step control circuits 351 start providing the step potential 214 to the display output terminal 190 with the same timing based on the same second timing signal (S203).

Next, after the potential of the display output terminal 190 becomes the step potential 214, the second step control circuits 351 turns the second switch 171 off and the first switch 170 on, thereby driving the display output terminal 190 to the H level or the L level potential. Here, the n second step control circuits 351 start driving the display output terminal 190 to the H level or the L level with different timings based on the third timing signal 403 which changes with a different timing (S204).

On the other hand, in the case where the pixel data 206 does not change (No, in S202), the second step control circuit 351 turns the second switch 171 off and the first switch 170 on, thereby driving the display output terminal 190 to the H level or the L level potential (S205).

It is to be noted that the processes as illustrated in FIG. 8 are performed by each of the structural elements corresponding to the respective display output terminals 190.

An example of operations of the display driving apparatus 101 will be described in detail below.

Figure 9:
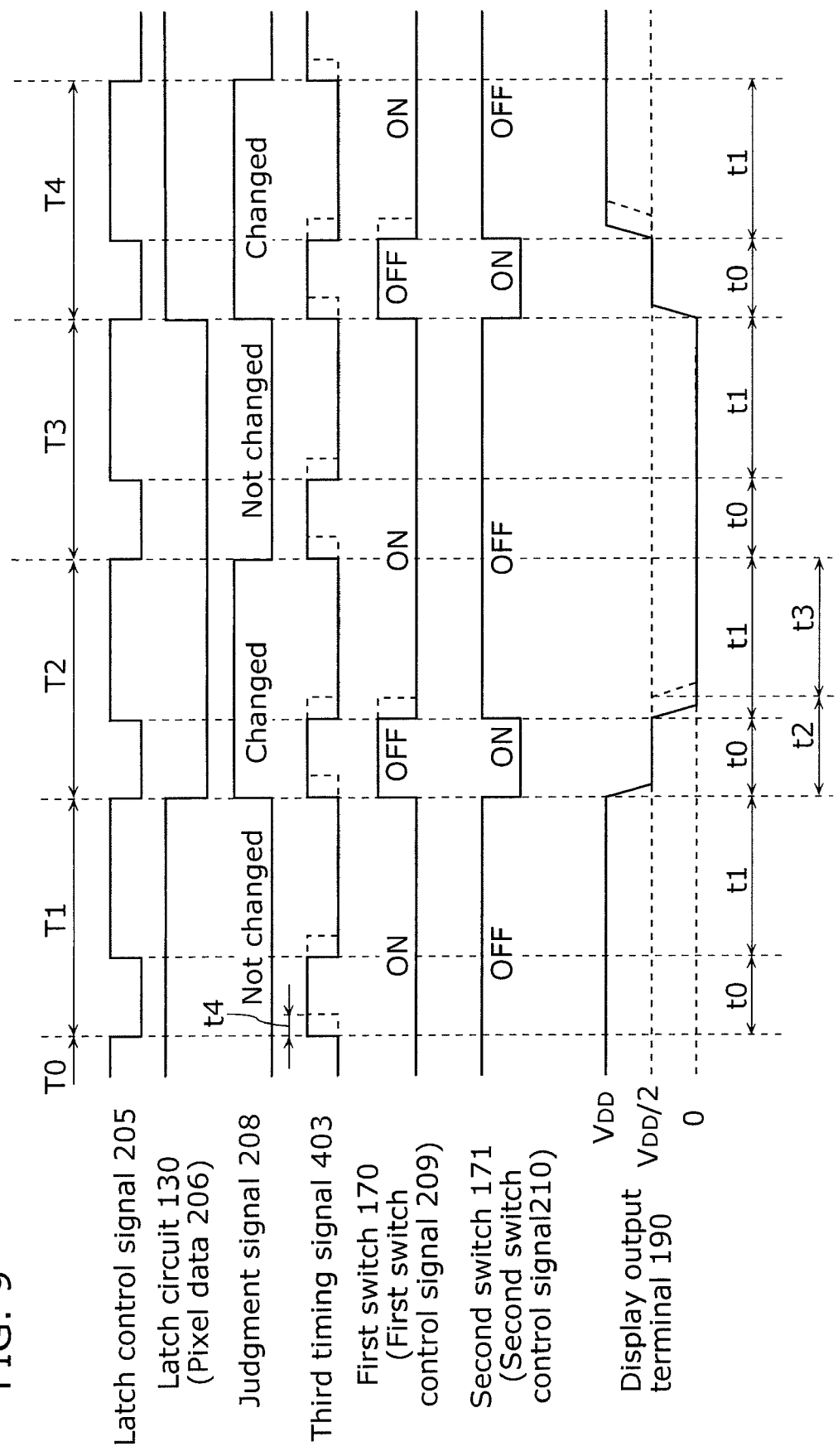
FIG. 9 is a timing diagram which illustrates operations of the display driving apparatus according to the second embodiment of the present invention.

FIG. 9 is a timing diagram which illustrates an operation of the display driving apparatus 101.

As illustrated in FIG. 9, the display driving apparatus 101 according to the second embodiment of the present invention drives the display output terminal 190 in two steps in the case where the pixel data 206 changes, as in the display driving apparatus 100 according to the first embodiment. This structure allows the display driving apparatus 100 to reduce power consumption.

Further, potentials of the third timing signal 403, the first switch control signal 209, and the display output terminal 190, each of which corresponds to a different display output terminal 190 are indicated by dashed lines in FIG. 9.

As illustrated in FIG. 9, the third timing signal 403 corresponding to the different display output terminal 190 changes with a timing that is delayed by a delay time t4 given in the delay circuit 120 from the signal indicated by a solid line. This causes a fall of the first switch control signal 209 (a timing with which the first switch 170 changes from off to on) to be delayed by the delay time t4. More specifically, the second step control circuit 351 turns the first switch 170 on at the time delayed by the delay time t4 from the second time period t1.

Further, a rising edge of the first switch control signal 209 (the timing with which the first switch 170 changes from on to off) is the same among the n first switch control signals 209, and the timing of change of the second switch control signal 210 is the same among the n second switch control signals 210.

Further, the n third timing signals 403 receive respective delay times t4 from the delay circuit 120.

Accordingly, the display driving apparatus 101 keeps the first switch 170 off during the first time periods t0 and t2 which start at the same time based on the timing of change of the horizontal synchronization signal 201 and end at different times. Further, the display driving apparatus 100 keeps the second switch 170 on during the identical first time period t0 based on the timing of change of the horizontal synchronization signal 201. This causes the plural display output terminals 190 to be driven to the step potential 214 with the same timing.

Further, the display driving apparatus 101 keeps the first switch 170 on during the second time period t1 and the second time period t3 which start at different times based on the timing of change of the horizontal synchronization signal 201 and end at the same time. Further, the display driving apparatus 100 turns the second switch off during the same second time period t1 based on the timing of change of the horizontal synchronization signal 201. This causes the plural display output terminals 190 to be driven to the H level or the L level from the step potential 214 with different timings.

As described above, the display driving apparatus 101 according to the second embodiment of the present invention can lower peak current, thereby reducing the EMI when the serial display data 202 changes.

Structures of the first step control circuit 350 and the second step control circuit 351 will be described in detail below.

Figure 10:
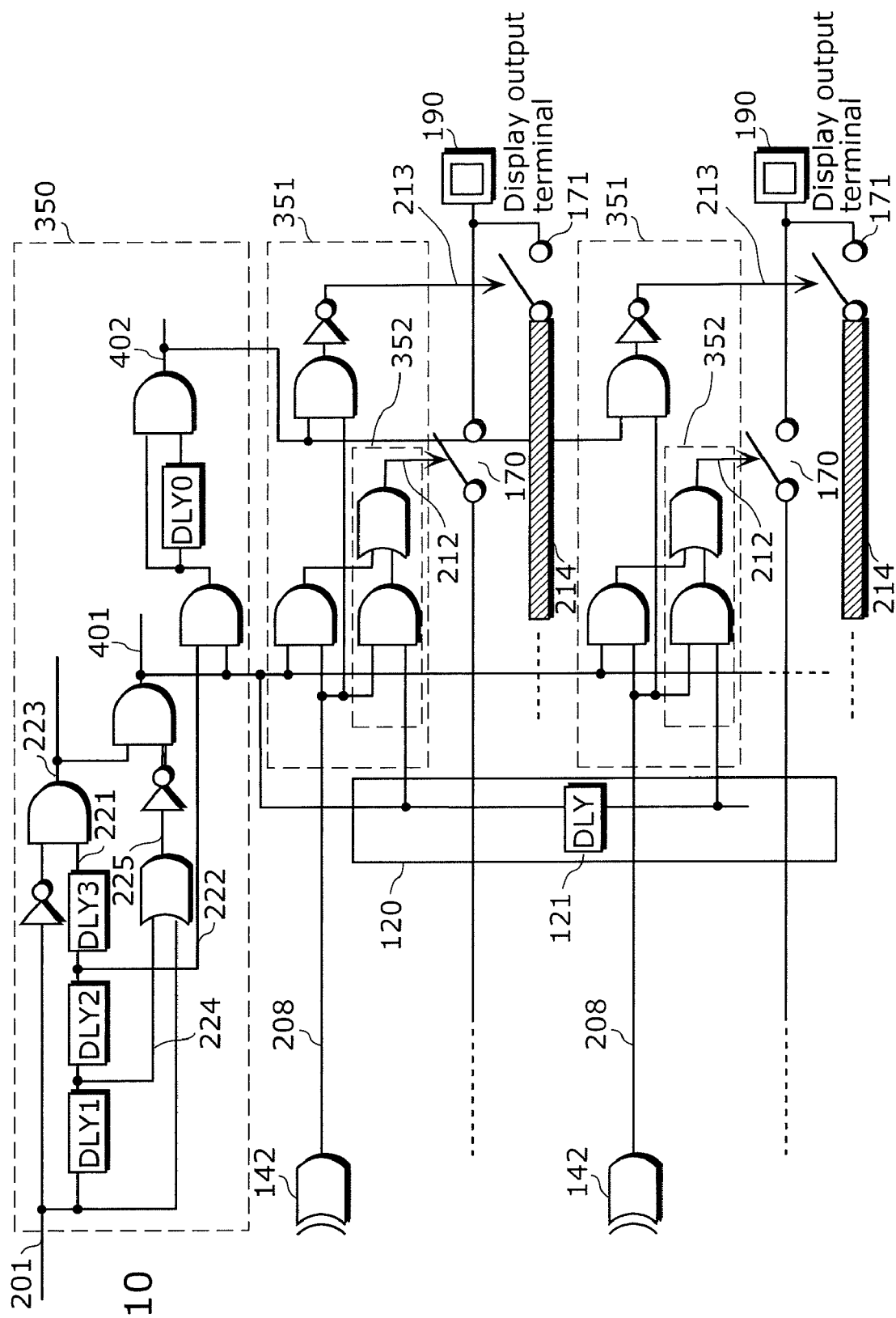
FIG. 10 is a circuit diagram which illustrates structures of a first step control circuit and a second step control circuit according to the second embodiment of the present invention.

FIG. 10 is a diagram which illustrates circuit structures of the first step control circuit 350 and the second step control circuit 351.

It is to be noted that the level shifters 162 and 163 are omitted in FIG. 10.

The structure of the first step control circuit 350 is the same as the structure of the timing generation unit 151 as illustrated in FIG. 5. The first step control circuit 350 generates the first timing signal 401 and the second timing signal 402 using the horizontal synchronization signal 201.

The second step control circuit 351 includes a delay control unit 352 in addition to the circuit structure of the change control unit 152 as illustrated in FIG. 5.

In the case where the pixel data 206 is judged to have changed due to a line data change (the case where the judgment signal 208 is at the L level), the second step control circuit 351 causes, without exception, the first switch control signal 212 to be at the L level and the second switch control signal 213 to be at the H level without depending on the logic of the signal 226 and the signal 229. In other words, the first switch 170 is turned on and the second switch 171 is turned off.

Figure 11:
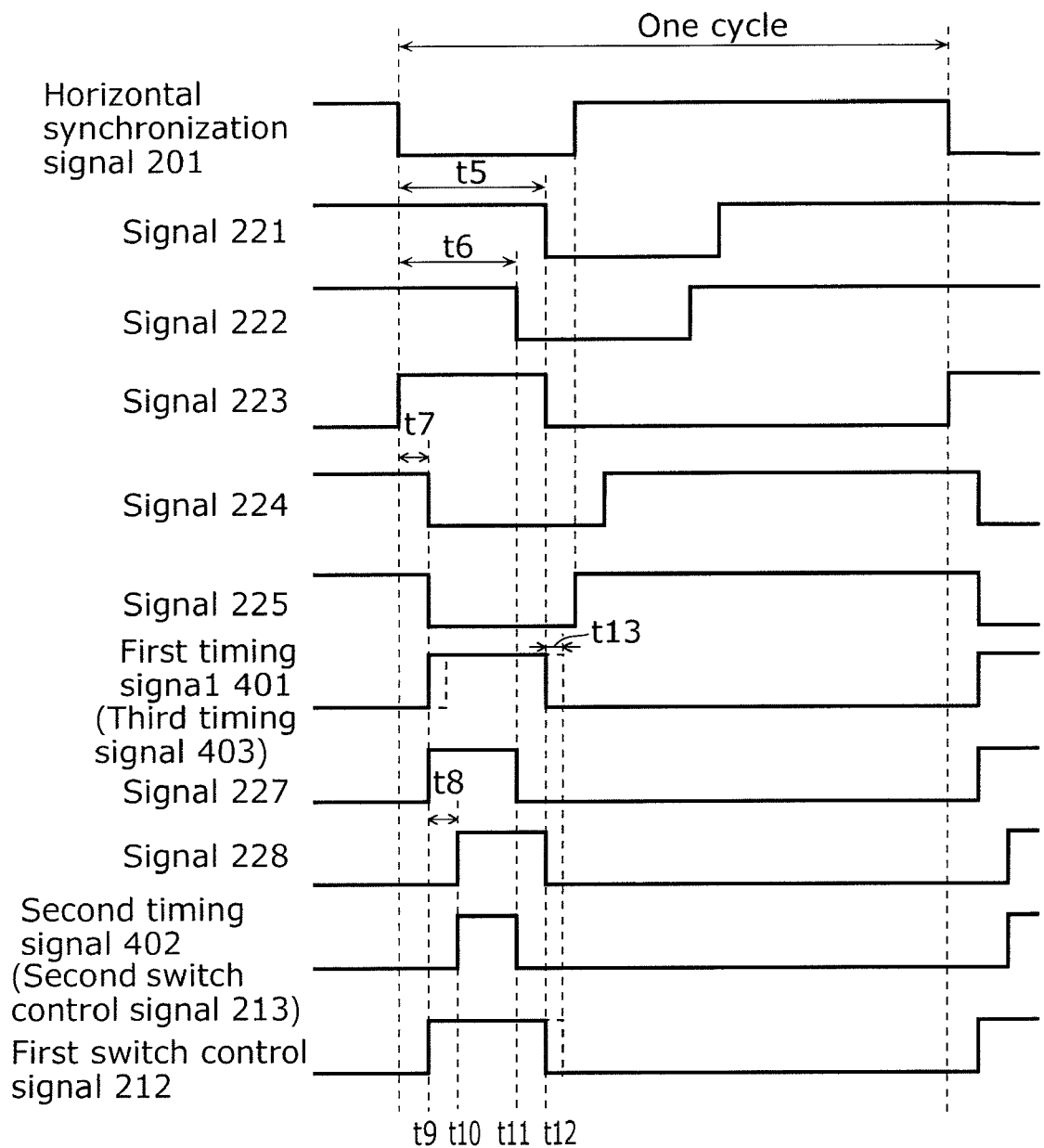
FIG. 11 is a timing diagram which illustrates operations of the first step control circuit and the second step control circuit according to the second embodiment of the present invention.

The delay control unit 352 controls, based on the third timing signal 403, the timing for turning the first switch 170 on. More specifically, the n delay control units 352 turns the first switch 170 on with different timings based on the timings of change of the third timing signals 403 that change with different timings FIG. 11 is a timing chart which illustrates an operation for one cycle of the timing generation unit 151. It is to be noted that the same numerals are assigned to the same elements as in FIG. 6 and the description that is overlapped will be omitted.

In FIG. 11, the delay time of the delay element 121 is indicated as a time t13.

Further, the first switch 170 is turned off in the case where the first timing signal 401, the third timing signal 403, and the first switch control signal 212 are at the H level, and turned on in the case where the first timing signal 401, the third timing signal 403, and the first switch control signal 212 are at the L level. The second switch 171 is turned on in the case where the second timing signal 402 is at the H level, and turned off in the case where the second timing signal 402 is at the L level As illustrated in FIG. 11, when the state where the first switch 170 is on and the second switch 171 is off changes to the state where the first switch 170 is off and the second switch 171 is on, the first switch 170 is turned off at the time t9 first, and then the second switch 171 is turned on at the time t10, as in the case of the display driving apparatus 100 according to the first embodiment.

Further, when the state where the first switch 170 is off and the second switch 171 is on changes to the state where the first switch 170 is on and the second switch 171 is off, the second switch 171 is turned off at the time t11 first, and then the first switch 170 is turned on at the time t12.

More specifically, the first step control circuit 350 and the second step control circuit 351, when turning the first switch 170 on, turn the first switch 170 on after turning the second switch 171 off without exception. Further, the first step control circuit 350 and the second step control circuit 351, when turning the second switch 171 on, turns the second switch 171 on after turning the first switch 170 off without exception. In other words, the timing generation unit 151 keeps the first switch 170 and the second switch 171 not to be on at the same time.

With this, in the display driving apparatus 101 according to the second embodiment of the present invention, the first switch 170 and the second switch 171 are kept not to be on at the same time, so that an instantaneous data conflict can be avoided without fail. With this, the display driving apparatus 101 can reduce the EMI without fail.

As described above, the display driving apparatus 101 according to the second embodiment of the present invention can achieve both the lowering power consumption and the lowering the EMI, as in the case of the display driving apparatus 100 according to the first embodiment.

Further, in the display driving apparatus 101 according to the second embodiment, a single first step control circuit 350 is used commonly for the n pixel data 206 (the display output terminals 190). With this, the circuit size of the display driving apparatus 101 according to the second embodiment can be more reduced compared to the circuit size of the display driving apparatus 100 according to the first embodiment, and thus it is possible to achieve a smaller size and lower costs of the display driving apparatus 101.

It is to be noted that the display driving apparatus 100 according to the first embodiment drives the plural display output terminals 190 to the step potential 214 with different timings, so that the EMI can be reduced more compared to the display driving apparatus 101 according to the second embodiment.

Further, although it is described that the delay circuit 120 includes the n-1 delay elements 121 connected in series in the first embodiment and the second embodiment, the delay circuit 120 may include n delay elements connected in series. In this case, n signals each outputted from corresponding one of the delay elements 121 connected in series are the n latch control signals 205 or the third timing signal 403.

Further, although it is described that the delay elements 121 delay the n latch control signals 205 and the third timing signal 403 so that a delay becomes greater in the order of the arrangement of the display output terminals 190 (in the direction from top to bottom in FIG. 1 and FIG. 11) in the first embodiment and the second embodiment, the delay may become greater irrelevant of the order of the arrangement of the display output terminals 190.

Figure 12:
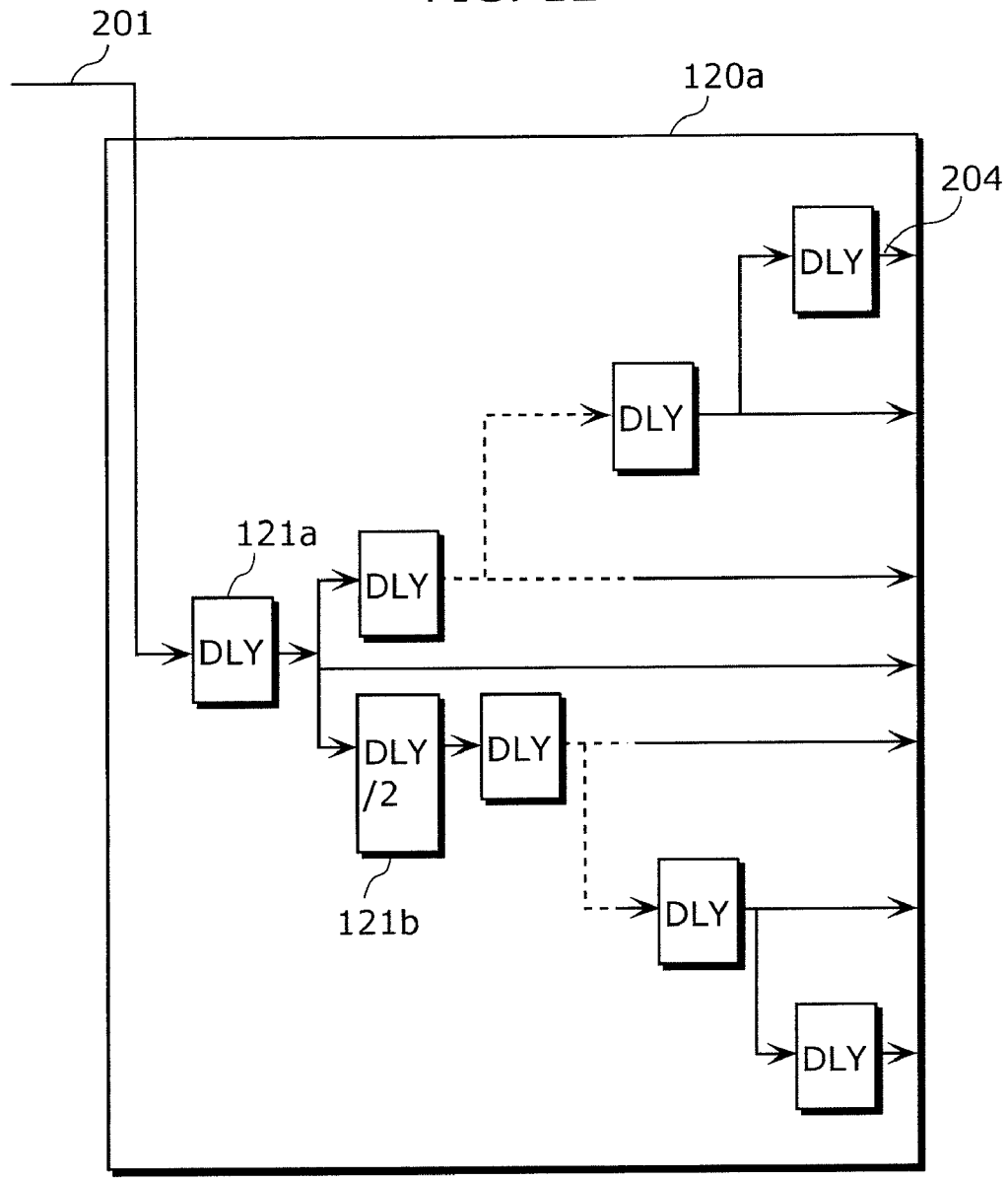
FIG. 12 is a diagram which illustrates a structure of an example of modification of a delay circuit according to the present invention.

Further, the delay circuit 120 may include plural delay elements 121 connected in a tree structure. FIG. 12 is a diagram which illustrates a structure of modification of the delay circuit 120.

A delay circuit 120a as illustrated in FIG. 12 includes plural delay elements 121a and a delay element 121b. The plural delay elements 121a and the delay element 121b are arranged in a tree shape with the wiring branching from around the center of the arrangement order of the display output terminal 190. Here, the delay elements 121a and the delay element 121b are different from each other in the delay amount. The delay amount of the delay element 121b is half the delay amount of the delay elements 121a, for example. It is to be noted that the delay circuit 120a may include two or more delay elements 121b, and may include a delay element that is different from the delay elements 121a and the delay element 121b in the delay amount.

With this, the n latch control signals (the third timing signal 403) change with different timings.

Further, although the number of the delay elements 121 used in the delay circuit 120a as illustrated in FIG. 12 and the delay circuit 120 as described above is the same, it is possible to reduce the number of stages of the delay elements 121a and the 121b through which signals pass from input to output. With this, the delay circuit 120a can reduce a cumulative delay time (the greatest delay time) compared to the delay circuit 120.

It is to be noted that the first branching is not limited to division into two branches, but may also be division into three branches. In this case, the delay circuit 120a includes the delay element 121a, the delay elements 121b, and the delay element having a different delay amount according to the number of the branches in the first stage.

THIRD EMBODIMENT

In a third embodiment of the present invention, a display module package, a display panel module, and a television set which include the display driving apparatus 100 or 101 according to the first embodiment or the second embodiment as described above will be described.

Figure 13:
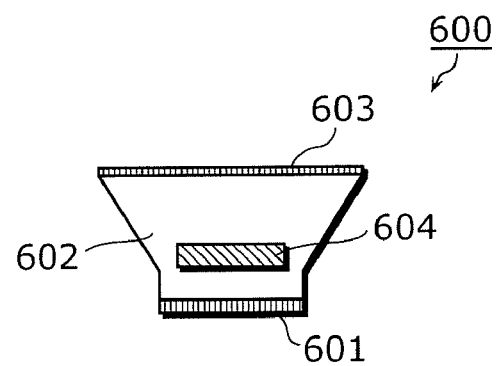
FIG. 13 is a top plan view which illustrates a structure of a module package according to a third embodiment of the present invention.

FIG. 13 is a top plan view which illustrates a structure of a display module package which uses the display driving apparatus 100 or 101 according to the present invention.

A display module package 600 as illustrated in FIG. 13 includes: a display input signal connection terminal 601; a flexible printed circuit board (FPC) 602; a display output connection terminal 603; and a data driver 604.

The data driver 604 corresponds to the display driving apparatuses 100 or 101 according to the present invention described above.

The display input signal connection terminal 601 is connected to a signal input terminal (a terminal to which a horizontal synchronization signal 201, serial display data 202, a pixel clock 203, and the like are inputted) via the FPC 602.

The display output connection terminal 603 is connected to plural display output terminals 190 of the data driver 604.

Figure 14:
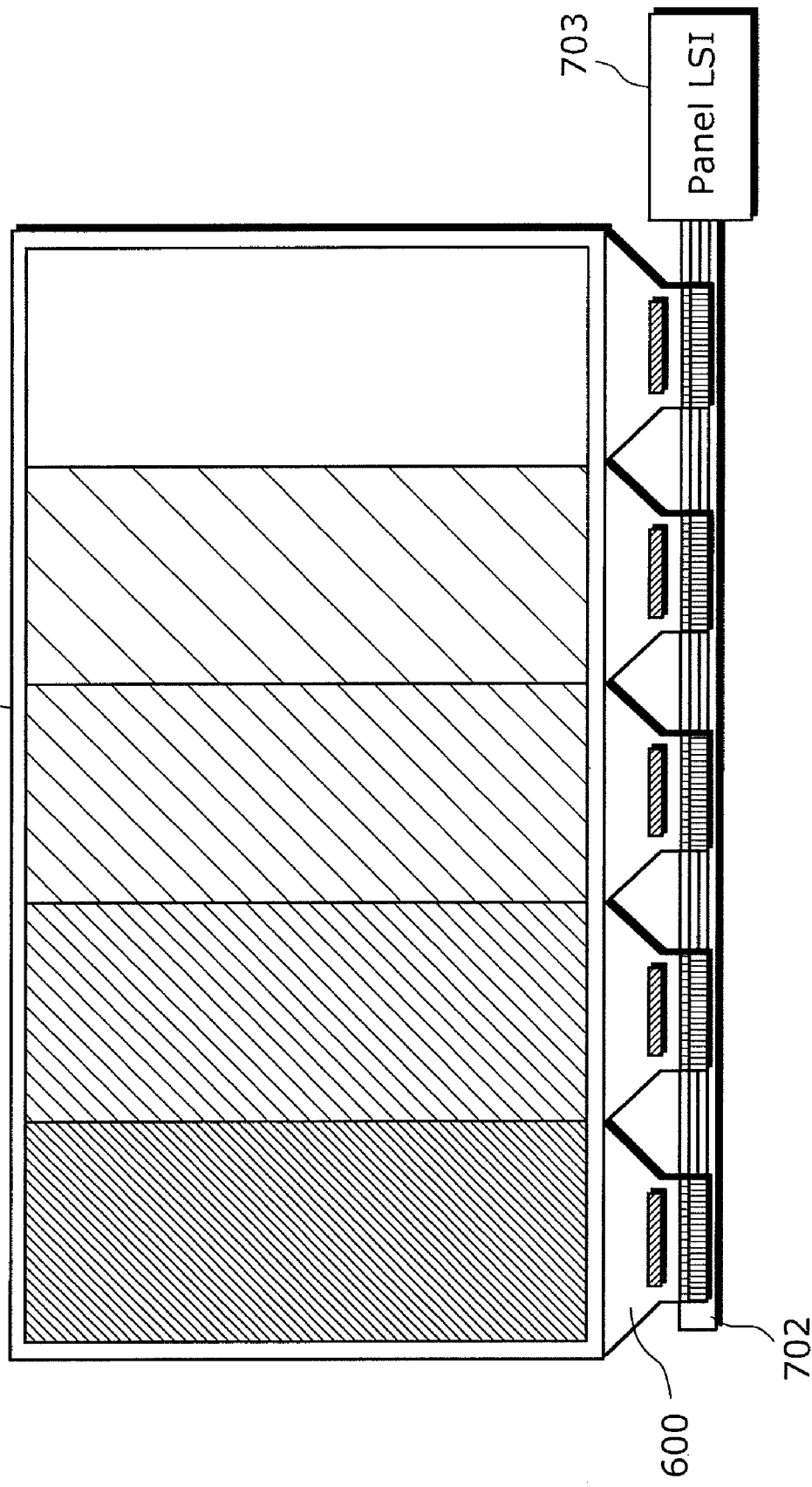
FIG. 14 is a top plan view which illustrates a structure of a panel module according to the third embodiment of the present invention.

FIG. 14 is a top plan view which illustrates a structure of a panel module including the display module package 600.

A display panel module 700 as illustrated in FIG. 14 includes: the plural display module packages 600; a PDP panel 701; a common display input circuit board 702; and a panel LSI 703.

Each of the display output connection terminals 603 of the plural display module packages 600 is connected to the PDP panel 701.

The panel LSI 703 generates a signal (the horizontal synchronization signal 201, the serial display data 202, the pixel clock 203, and the like) which controls display driving of the PDP panel 701, and outputs the generated signal to the display input signal connection terminal 601 of the plural display module packages 600 via the common display input circuit board 702.

As described above, a single display module package 600 is used for each column of plural divisions of the PDP panel 701. By having such a structure, power consumption reduction in each of the data drivers 604 significantly contributes to power consumption reduction in the entire display panel module 700.

Figure 15:
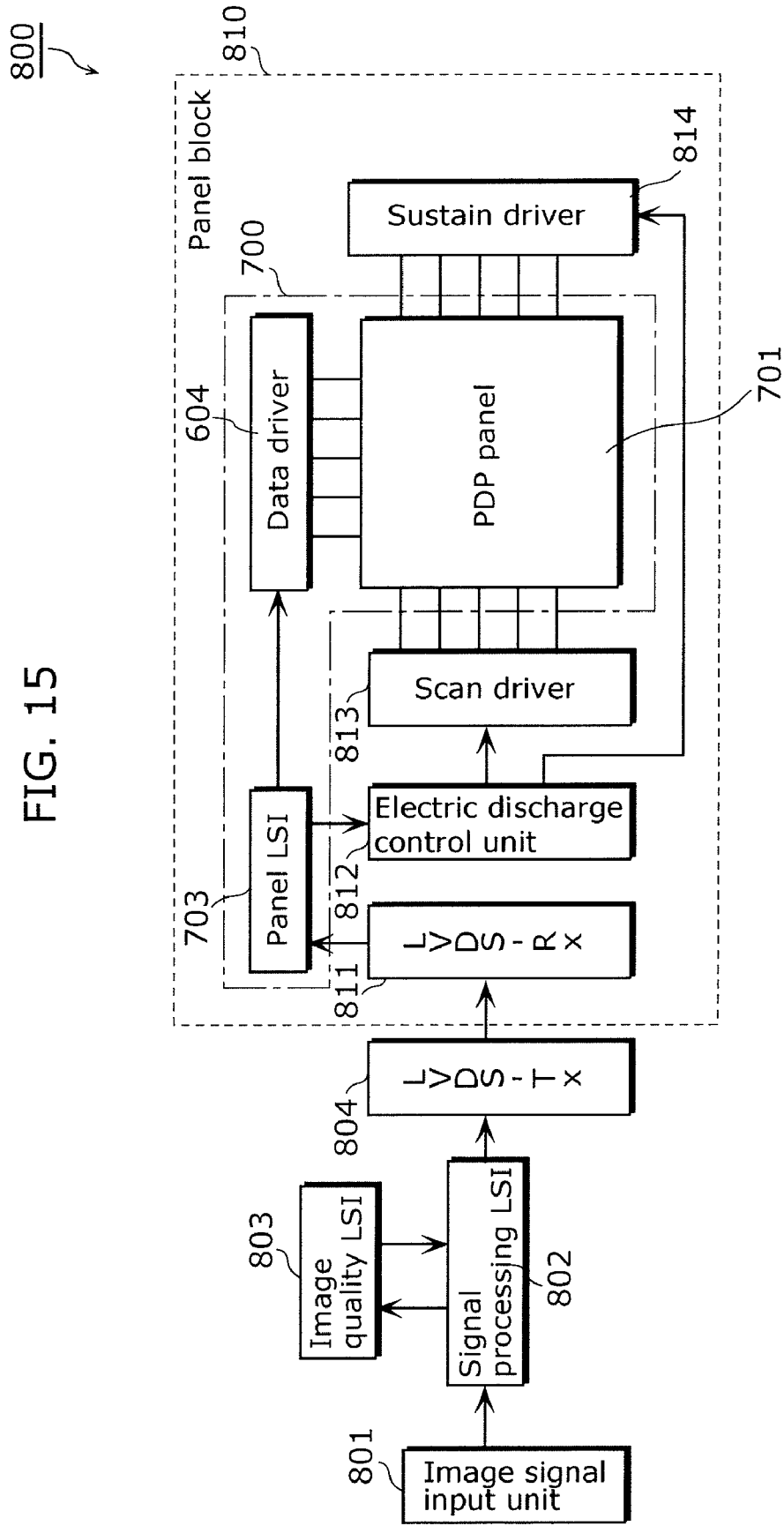
FIG. 15 is a block diagram which illustrates a structure of a television set according to the third embodiment of the present invention.

FIG. 15 is a block diagram which illustrates a structure of a PDP television set which includes the display panel module 700.

The television set 800 as illustrated in FIG. 15 includes: an image signal input unit 801; a signal processing LSI 802; an image quality LSI 803; a low voltage differential signaling (LVDS) transmitter (LVDS-Tx) 804; and a panel block 810. The panel block 810 includes: an LVDS receiver (LVDS-Rx) 811, an electric discharge control unit 812; a scan driver 813; a sustain driver 814; the display panel module 700.

An image data to be displayed on the PDP panel 701 is inputted into the image signal input unit 801.

The signal processing LSI 802 and the image quality LSI 803 perform signal processing such as image quality adjustment on the image data inputted into the image signal input unit 801.

The LVDS transmitter 804 converts the image data signal-processed by the signal processing LSI 802 into two differential signals.

The LVDS receiver 811 restores the differential signals converted by the LVDS transmitter 804 to be normal signals. By utilizing the LVDS, power consumption can be reduced.

The panel LSI 703 generates serial display data 202, a horizontal synchronization signal 201, a vertical synchronizing signal, and the like based on the image data (display data) restored by the LVDS receiver 811.

The data driver 604 drives a data electrode of the PDP panel 701 according to the serial display data 202 generated by the panel LSI 703.

The electric discharge control unit 812 performs such controls as a subfield control, an auxiliary electric discharge control, and a gradation control of display data. The electric discharge control unit 812 generates a control signal that controls the scan driver 813 and the sustain driver 814 based on the horizontal synchronization signal 201 and the vertical synchronizing signal.

The scan driver 813 and the sustain driver 814 respectively drive a scan electrode and a sustain electrode of the PDP panel 701 based on the control signal generated by the electric discharge control unit 812.

As described above, the display driving apparatuses 100 and 101 according to the present invention can easily be incorporated into an image display system such as the television set 800 that is provided with a display panel such as the PDP.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention is applicable to display driving apparatuses, and in particular to a driver of a display panel that includes capacitive load such as the PDP or an electroluminescence (EL) panel.

What is claimed is:

1. A display driving apparatus which outputs n drive signals to n display output terminals in a predetermined cycle according to n pixel data included in display data for a single line, n being an integer equal to or greater than two, and each of the n drive signals driving a panel electrode, said display driving apparatus comprising:
   n level shift units corresponding to the n pixel data and the n display output terminals in a one-to-one relationship, and configured to shift a voltage level of corresponding pixel data and output one of a first potential and a second potential, said n level shift units;
   a step potential providing unit configured to provide a step potential which is between the first potential and the second potential;
   a change judgment unit configured to judge whether or not each of the n pixel data has changed from pixel data of an immediately previous cycle;
   a delay unit configured to generate n timing signals based on a horizontal synchronization signal that synchronizes with the cycle, the n timing signals corresponding to the n display output terminals in a one-to-one relationship and changing with different timings; and
   a control unit configured to perform control such that the display output terminal corresponding to the pixel data judged to have changed by said change judgment unit is provided with: the step potential provided by said step potential providing unit during a first time period included in each of the cycle; and the first potential or the second potential outputted from said corresponding level shift unit during a second time period that is contained in the cycle, subsequent to the first time period, and different between the display output terminals and is based on a timing of change of the corresponding timing signal.

2. The display driving apparatus according to claim 1, further comprising:
   n latch units corresponding to the n pixel data in a one-to-one relationship, and configured to hold the corresponding pixel data with a timing based on the horizontal synchronization signal and output the pixel data which has been held;
   n first switches corresponding to the n pixel data, said n level shift units, and the n display output terminals in a one-to-one relationship, each of said n first switches being connected between an output terminal of said corresponding level shift unit and the corresponding display output terminal; and
   n second switches corresponding to the n pixel data, said n first switches, and the n display output terminals in a one-to-one relationship, each of said n second switches being connected between an output terminal of said step potential providing unit and the corresponding display output terminal,
   wherein said control unit is configured to keep said first switch off and keep said second switch on during the first time period, and keep said second switch off and keep said first switch on during the second time period based on the timing of change of the corresponding timing signal, each of said first switch and said second switch corresponding to the pixel data judged to have changed by said change judgment unit.

3. The display driving apparatus according to claim 2, wherein said delay unit is configured to generate the n timing signals by providing the horizontal synchronization signal with a delay that is different for each timing signal, and
said control unit is configured to keep said n first switches off and keep said n second switches on during the first time periods that are different from one another and based on the timing of change of the n timing signals.

4. The display driving apparatus according to claim 2, wherein said control unit is configured to keep said n first switches off and keep said n second switches on during the same first time period based on the timing of change of the horizontal synchronization signal.

5. The display driving apparatus according to claim 4, wherein said control unit includes a first control unit configured to generate a first signal and a second signal based on the horizontal synchronization signal and keep said n second switches on by using the second signal during the same first time period, the second signal causing said n second switches to be turned on or off,
said delay unit is configured to generate the n timing signals by providing the first signal with a delay that is different for each timing signal, each of the n timing signals changing with a different timing, and
said control unit further includes a second control unit configured to keep said n first switches on based on the n timing signals during the second time periods that are different from one another and start at different times.

6. The display driving apparatus according to claim 2, wherein said control unit is configured to keep said corresponding second switch off and keep said corresponding first switch on during the first time period and the second time period in the case where said change judgment unit judges that the pixel data held by said corresponding latch unit has not changed.

7. The display driving apparatus according to claim 2, wherein the step potential is a potential that is a midpoint of the first potential and the second potential.

8. The display driving apparatus according to claim 2, wherein said delay unit includes n−1 delay elements connected in series, and
the n timing signals include n−1 signals outputted from each of the n−1 delay elements.

9. The display driving apparatus according to claim 8, wherein said delay unit is configured to generate the n timing signals such that a delay becomes greater in an order of an arrangement of the display output terminals, the n timing signals corresponding to the n display output terminals in a one-to-one relationship.

10. The display driving apparatus according to claim 2, wherein said delay unit includes a plurality of delay elements connected in a tree structure.

11. The display driving apparatus according to claim 2, wherein said control unit is configured to keep said corresponding first switch and second switch not to be concurrently on.

12. The display driving apparatus according to claim 11, wherein said control unit is configured to perform control such that said first switch is turned on after said second switch corresponding to said first switch is tuned off whenever said first switch is turned on, and that said second switch is turned on after said first switch corresponding to said second switch is turned off whenever said second switch is turned on.

13. A display module package comprising a display driving apparatus recited in claim 1.

14. A display panel module comprising a display module package recited in claim 13.

15. A television set comprising a display panel module recited in claim 14.

* * * * *